(12) United States Patent
Jin

(10) Patent No.: US 7,820,064 B2
(45) Date of Patent: Oct. 26, 2010

(54) SPINODALLY PATTERNED NANOSTRUCTURES

(75) Inventor: Sungho Jin, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 42 days.

(21) Appl. No.: 11/914,106

(22) PCT Filed: May 10, 2006

(86) PCT No.: PCT/US2006/018138

§ 371 (c)(1),
(2), (4) Date: Jan. 24, 2008

(87) PCT Pub. No.: WO2007/081381

PCT Pub. Date: Jul. 19, 2007

(65) Prior Publication Data

US 2008/0268288 A1 Oct. 30, 2008

Related U.S. Application Data

(60) Provisional application No. 60/679,697, filed on May 10, 2005.

(51) Int. Cl.
*G11B 5/62* (2006.01)
(52) U.S. Cl. ...................................... 216/41
(58) Field of Classification Search .............. 216/41, 216/51, 49, 96
See application file for complete search history.

(56) References Cited

U.S. PATENT DOCUMENTS

| | | | | |
|---|---|---|---|---|
| 6,242,326 B1 * | 6/2001 | Ro et al. | ...................... | 438/493 |
| 7,067,207 B2 * | 6/2006 | Kamata et al. | .............. | 428/836 |
| 7,094,679 B1 * | 8/2006 | Li et al. | ...................... | 438/618 |
| 7,315,426 B2 * | 1/2008 | Kim et al. | .................... | 359/738 |
| 2004/0240157 A1 * | 12/2004 | Legagneux et al. | ......... | 361/516 |
| 2005/0094549 A1 * | 5/2005 | Hieda et al. | ................. | 369/277 |

OTHER PUBLICATIONS

Hiroyuki Suzuki et al, IEEE Transactions on Magnetics, vol. 27, No. 6, 1991, pp. 4718-4720.*
Dong Ki Nam et al, Polymers forAdvanced Technologies, vol. 1,(1990), 219-224.*
Travis R. Miller et al , Physics Letters b. 488(2000), 313-318.*
Cahn, J., "On Spinodal Decomposition in Cubic Crystals," Acta Metallurgica vol. 10, p. 179-183 (Mar. 1962).
Chan et al.; "Ordered Bicontinuous Nanoporous and Nanorelief Ceramic Films for Self-Assembling Polymer Precursors," Science 286: 1716-1719 (1999).
Gleiter et al., "Nanostructured Materials: Basic Concepts and Microstructure," Acta Matallurgica vol. 48, pp. 1-29 (2000).
Guy, A.G. and J.J. Hren, *Elements of Physical Metallurgy*, Third Edition, Addison-Wesley Publishing Company, Menlo Park, CA 1974, pp. 425-427.
Hsieh, J. and W. Fang, A boron etch-stop assisted lateral silicon etching process for improved high-aspect-ratio silicon micromachining and its applications, J. Micromechanics and Microengineering, vol. 12, p. 574-581 (2002).

(Continued)

*Primary Examiner*—Michael Cleveland
*Assistant Examiner*—Tabassom Tadayyon Eslami
(74) *Attorney, Agent, or Firm*—Perkins Coie LLP

(57) ABSTRACT

Devices based on spinodally decomposed periodic structures and their fabrication techniques.

23 Claims, 23 Drawing Sheets

OTHER PUBLICATIONS

Hu, G. et al., "Magnetization reversal in Co/Pd nanostructures and films," Journal of Applied Physics, vol. 97, p. 10J702-1 10J02-3, (2005).

Jessensky et al., "Self-organized formation of hexagonal pore arrays in anodic alumina," Applied Physics Letters 72(10): 1173-1175 (1998).

Jin et al., "A Low Cobalt Ternary Cr-Co-Fe Alloy for Telephone Receiver Magnet Use," IEEE Transactions on Magnetics, vol. MAG-16, No. 1, pp. 139-146 (1980).

Jin, S. and G.Y. Chin, "Fe-Cf-Co Magnets," IEEE Transactions on Magnetics vol. Mag-23, No. 5, pp. 3187-3192 (1987).

Judy, J.H., "Advancements in PMR thin-film media," Journal of Magnetism and Magnetic Materials, vol. 287, pp. 16-26 (2005).

Judy, J.W., "Microelectromechanical systems (MEMS): fabrication, design and applications," Smart Materials and Structures, vol. 10, p. 1115-1134 (2001).

Li et al., "Hexagonal pore arrays with a 50-420 nm interpore distance formed by self-organization in anodic alumina," Journal of Applied Physics 84: 6023-6026 (1998).

Lu et al., "Time and orientation dependence of ordering in anodized aluminum for self-organized magnetic arrays," Journal of Applied Physics 87: 4721-4723 (2000).

Masuda, H. and K. Fukuda, "Ordered Metal Nanohole Arrays Made by a Two-Step Replication of Honeycomb Structures of Anodic Alumina," Science vol. 268, No. 5216, pp. 1466-1468 (1995).

Moser, A. et al., "Magnetic recording: advancing into the future," Journal of Physics D: Appl. Phys. vol. 35, p. R157-R167 (2002).

Murray et al., "Self-Organization of CdSe Nanocrystallites into Three-Dimensional Quantum Dot Superlattices," Science vol. 270, No. 5240, pp. 1335-1338 (1995).

Ogryzlo, E.A., "Doping and crystallographic effects in Cl-atom etching of silicon," Journal of Applied Physics, vol. 67, p. 3115-3120 (1990).

Pai et al., "Mesoporous Silicates Prepared Using Preorganized Templates in Supercritical Fluids," Science 303: 507-510 (2004).

Park et al., "Blcok Copolymer Lithography: Periodic Arrays of~$10^{11}$ Holes in 1 Square Centimeter," Science 276: 1401-1404 (1997).

Victoria, R. "Perpendicular Recording Media," *The Physics of Ultra-High-Density Magnetic Recording*, Martin L. Plumer et al. (Eds.), Chapter 8, Springer-Verlag Berlin Heidelberg, pp. 230-248, 2001.

Richter, H.J., "Recent advances in the recording physics of thin-film media," Journal of Physics D: Appl. Phys. vol. 32, p. R147-R168 (1999).

Shewmon, P.G., *Transformations in Metals*, McGraw-Hill Book Company, New York, pp. 291-299, 1969.

Speetzen et al, "Reducing average grain and domain size in high-coercivity Co/Pd perpendicular magnetic recording media through seedlayer engineering," Journal of Applied Physics, vol. 97, p. 10N118-1-10N118-3 (2005).

Sun et al., "Monodisperse FePt Nanoparticles and Ferrogmagnetic FePt Nanocrystal Superlattices," Science 287: 1989-1992 (2000).

Templin et al., "Organically Modified Aluminosilicate Mesostructures from Block Copolymer Phases," Science 278: 1795-1798 (1997).

Terris, B.D., "Nanofabricated and self-assembled magnetic structures as data storage media," Journal of Physics D, vol. 38, pp. R199-R222 (2005).

Thurn-Albrecht et al., "Ultrahigh-Density Nanowire Arrays Grown in Self-Assembled Diblock Copolymer Templates," Science 290: 2126-2129 (2000).

Tian, W.C., et al., "Released submicrometer Si microstructures formed by one-step dry etching," Journal of Vacuum Science & Technology, vol. B. 19(2), pp. 433-438 (2001).

Ukraintzev, V.A. et al., "Strong effect of dopant concentration gradient on etching rate," Journal of Vacuum Science & Technology, vol. B 16(1), pp. 476-480 (1998).

Victora, R.H., "Superlattice magnetic recording media: experiment and simulation," Journal of Magnetism and Magnetic Materials, vol. 235, pp. 305-311 (2001).

Wood, R. et al., "Perpendicular recording: the promise and the problems," Journal of Magnetism and Magnetic Materials, vol. 235, p. 1-9 (2001).

* cited by examiner

Fig. 3 Thin Film Layer Patterning by Spinodal Process (for Nano Islands fabrication)

Fig. 5 Thin Film Layer Patterning by Spinodal Process (for Nano Holes fabrication)

Hetero Epitaxially or Preferential Nucleation Grown Nano Island Array using Spinodally Created Mask Pattern Fig. 10 Composite Nano-Island Array by Deposition on Spinodally Created Island Template Fig. 11 Nano-Lithography Using Spinodally Produced Nano-Island or Nano-Pore Mask Fig. 12 Metal Deposition through Nano-Pore Array for Nano-Imprint Mask Fabrication Fig. 13 Spinodally Created Islands for Ultra-High-Density Patterned Media of Magnetic Recording – with no SUL, on SUL or on Pattern SUL (by RIE or Chemical Etch)

Use of Spinodally Created Periodic Islands for Vertical Textured or Hetero-Epitaxial Growth of Another Material

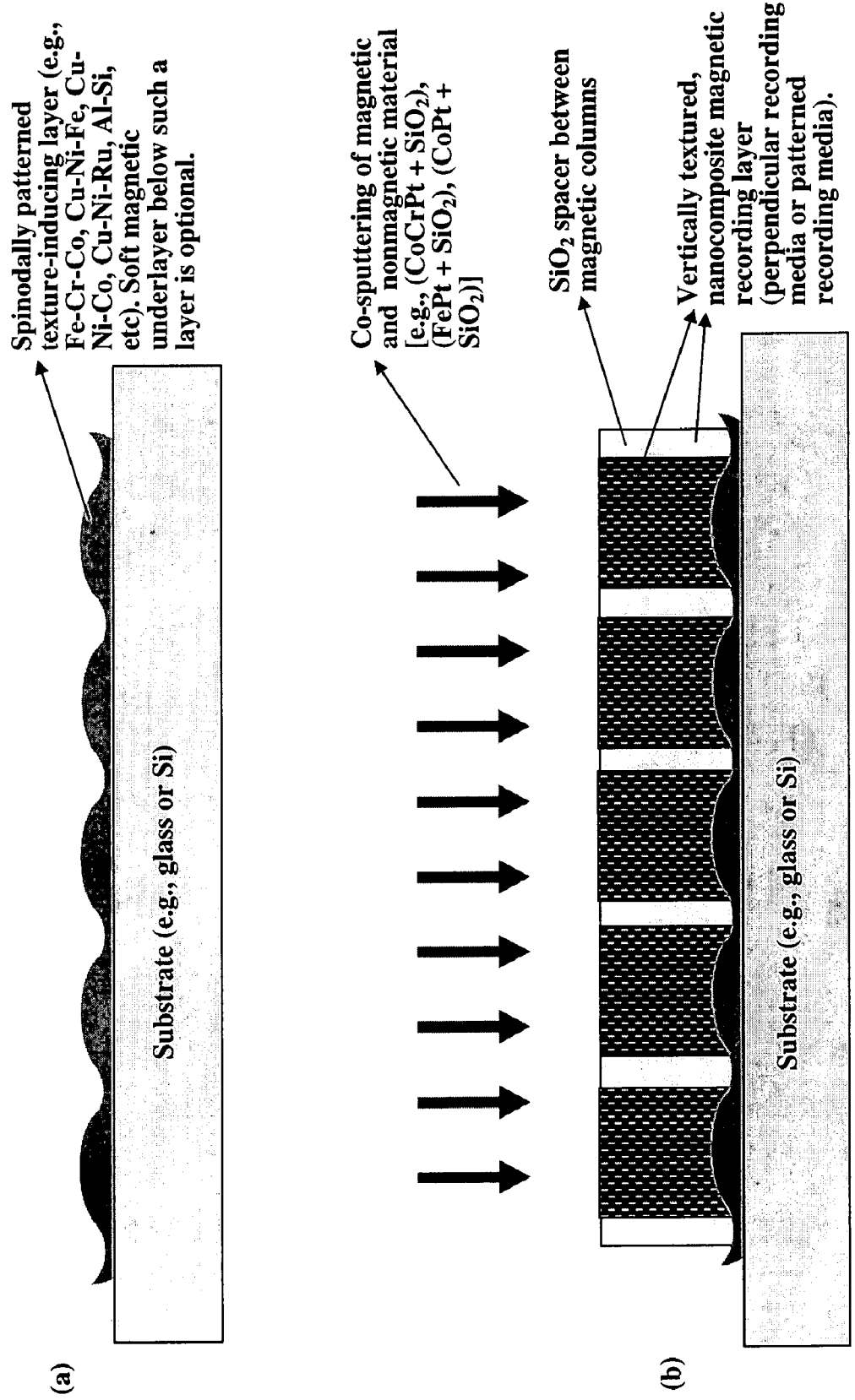
Fig. 15 Use of Spinodally Created Periodic Islands for Vertical Hetero-Epitaxial Growth of Another Material

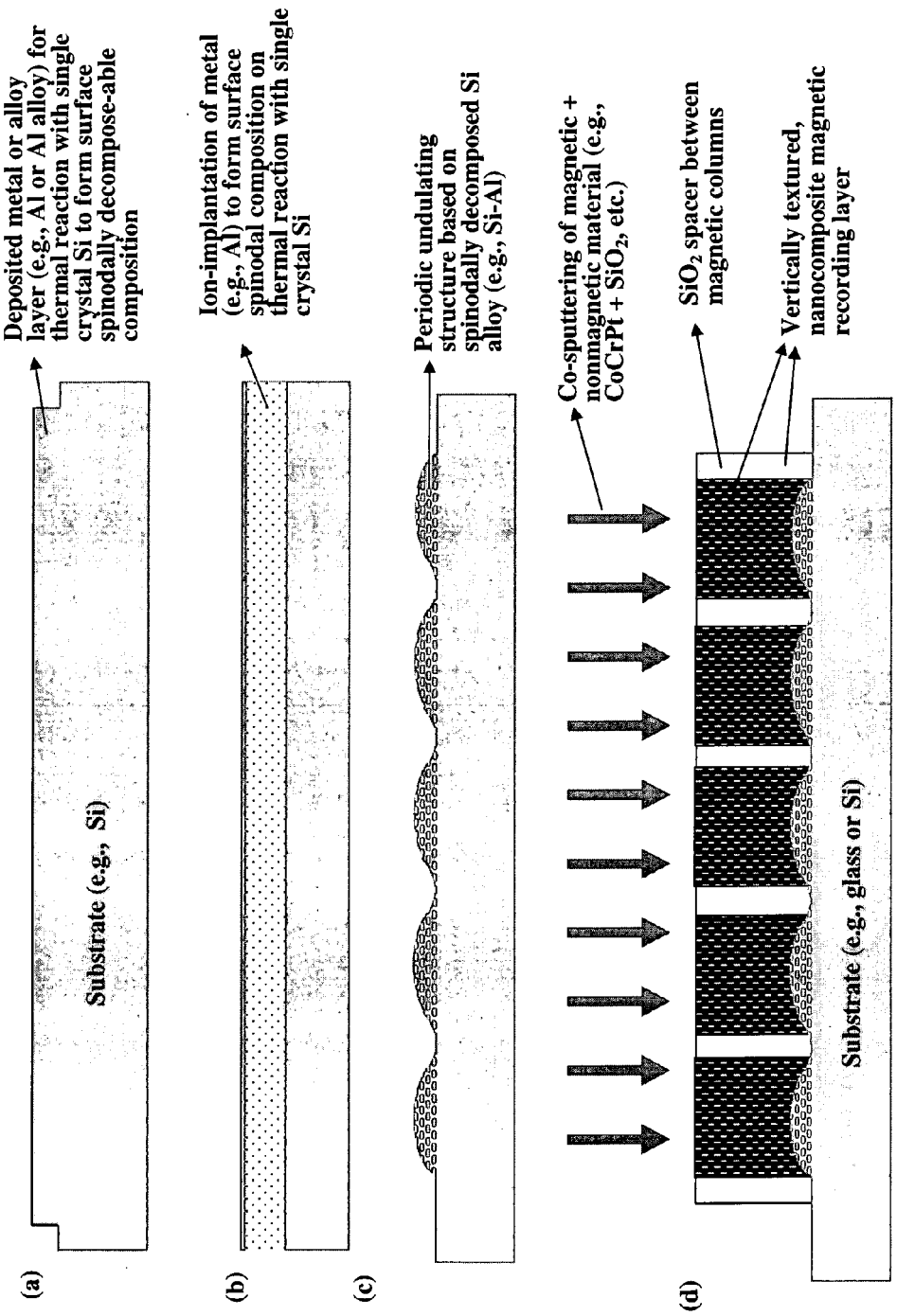
Fig. 16 Creation of Single-Crystal-Si-based Spinodal Pattern for Periodic Magnetic Structure

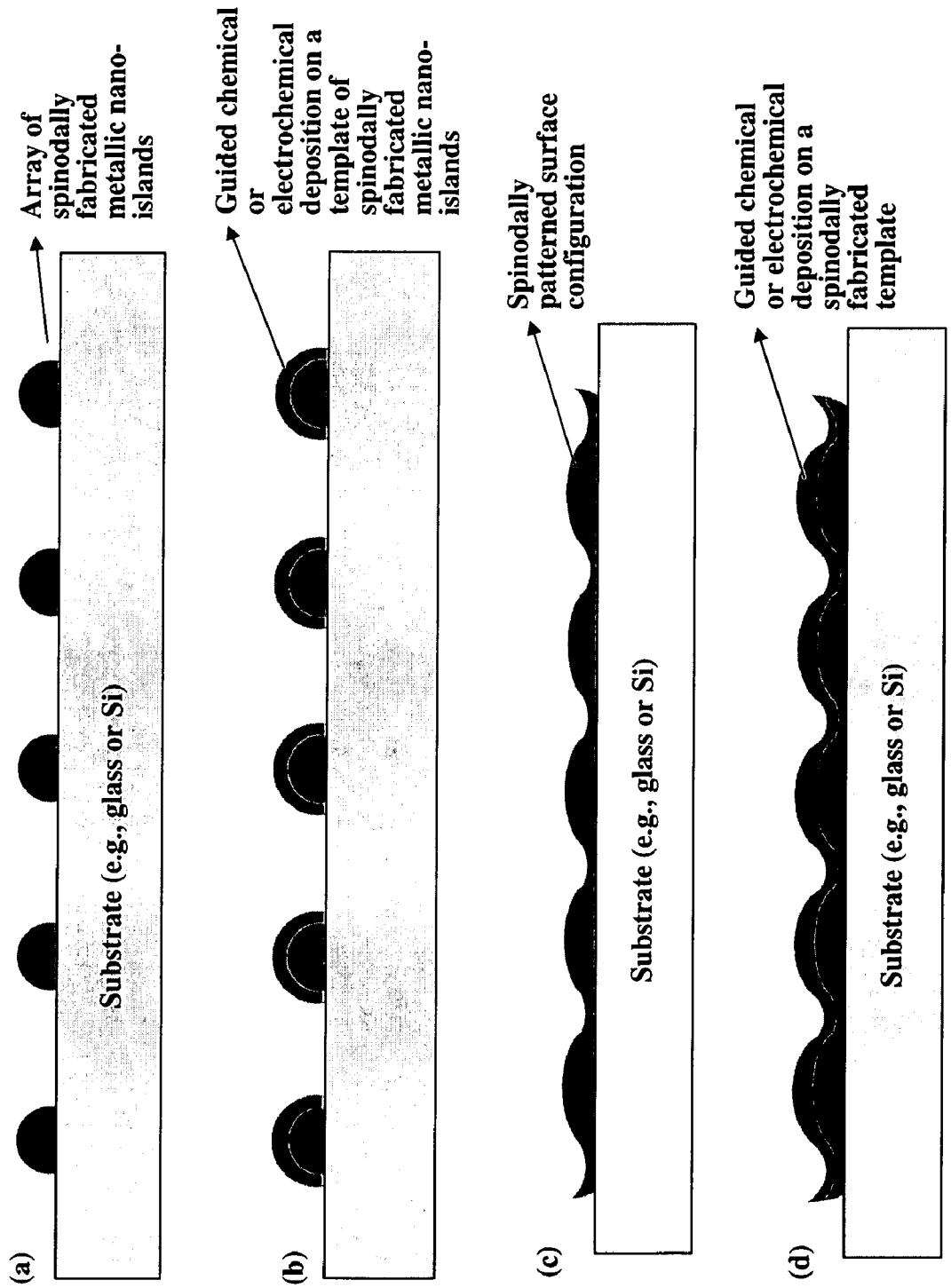
Fig. 17 Guided Chemical or Electrochemical Precipitation on Spinodally Created Island Template

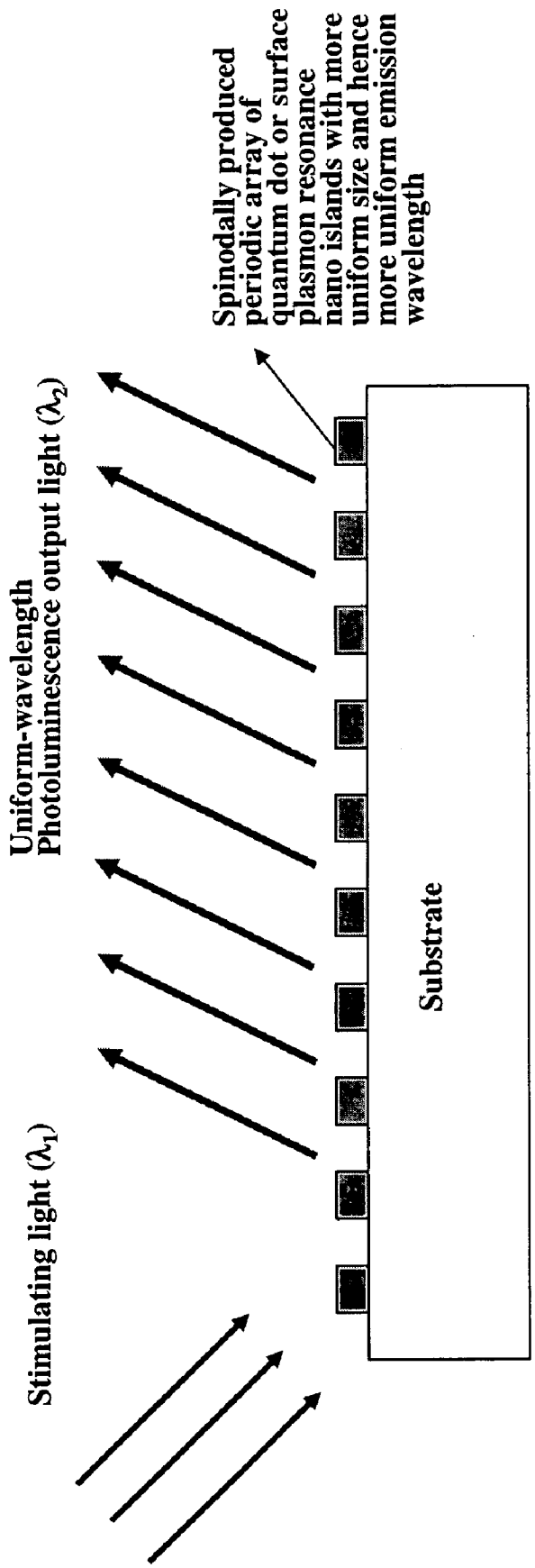
Fig. 18 Quantum dot devices or surface plasmon resonance devices using stimulated luminescence

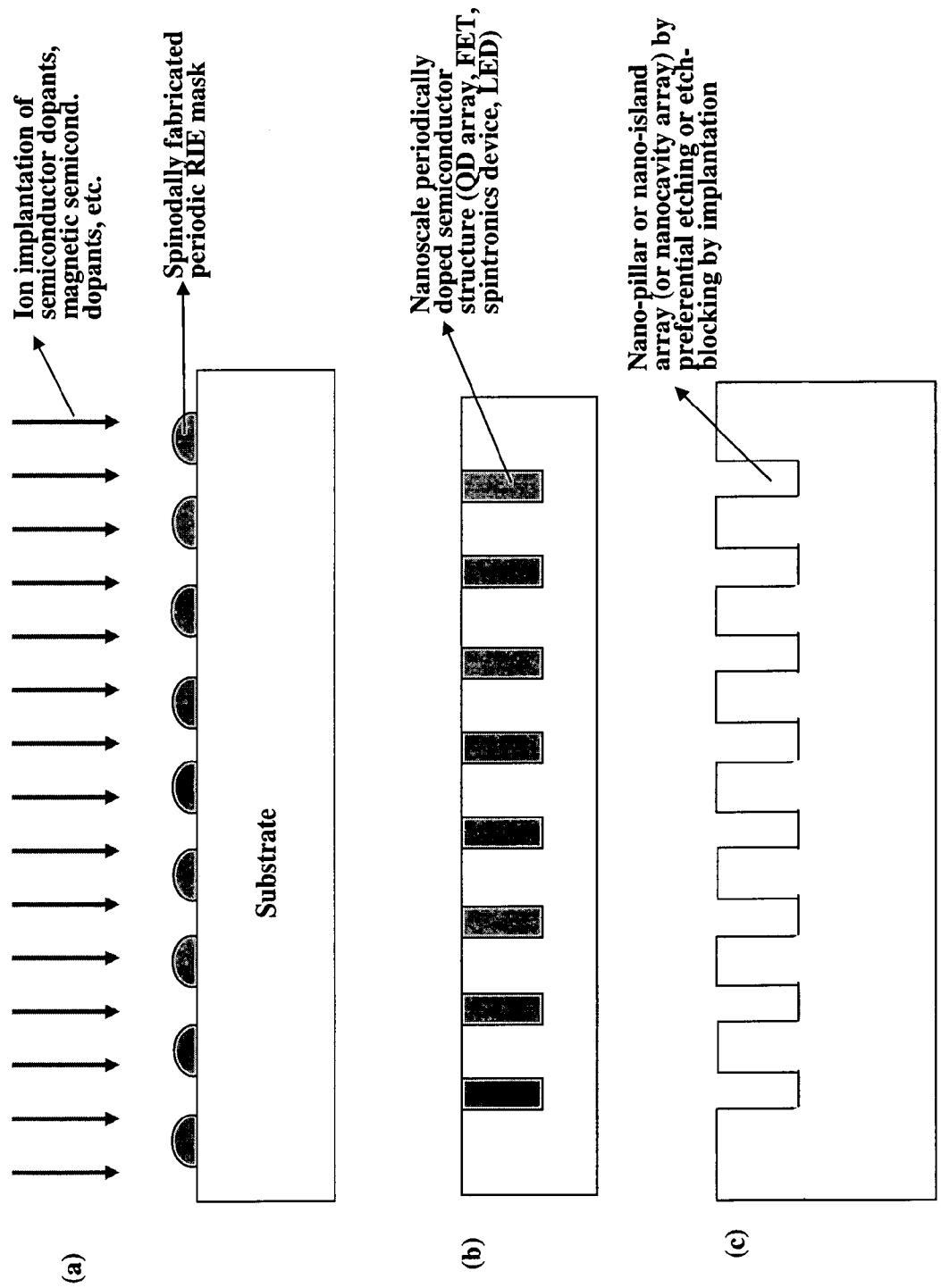
Fig. 19 Periodically implanted structure for nano-doped semiconductors or nanocavity fabrication

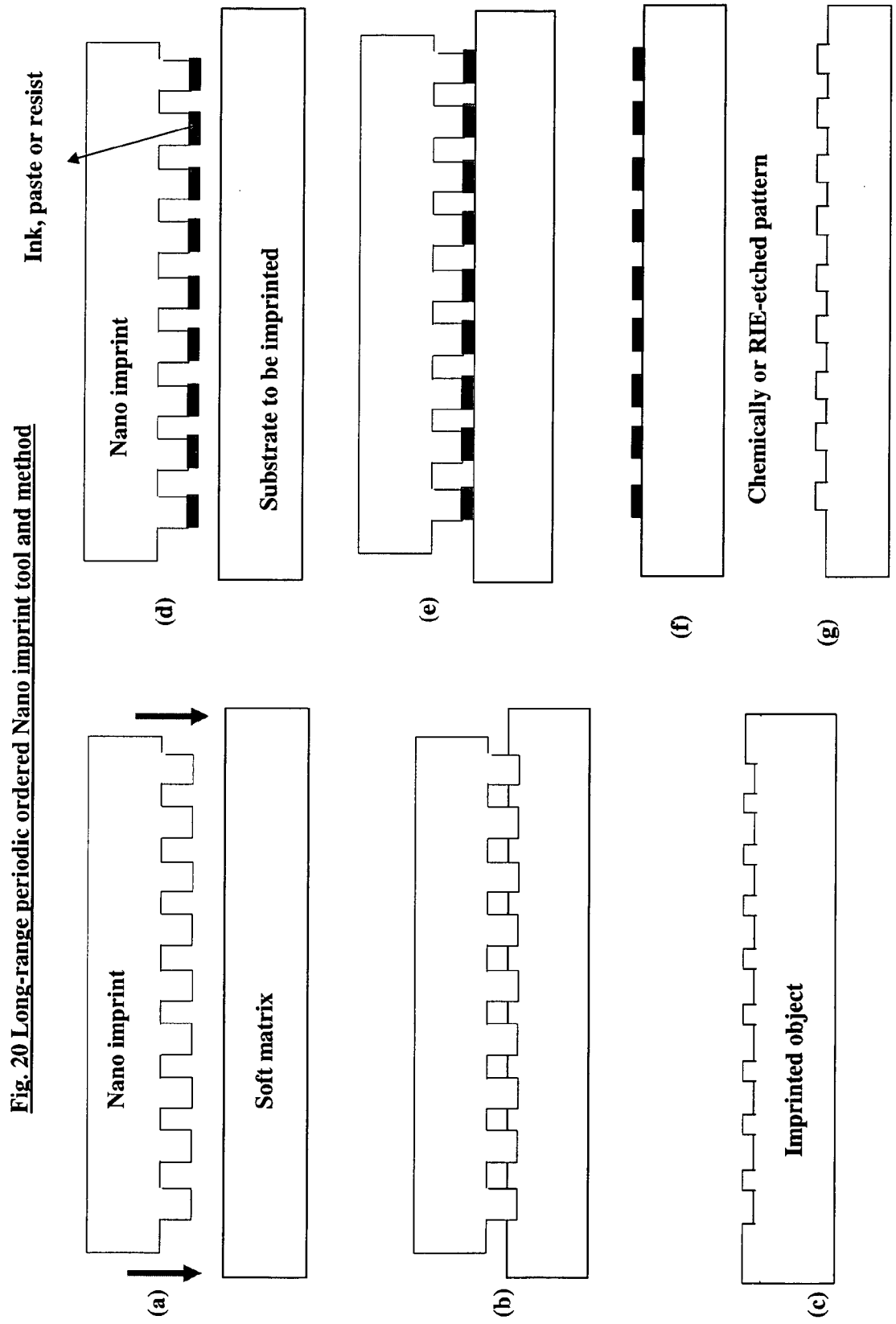
Fig. 20 Long-range periodic ordered Nano imprint tool and method

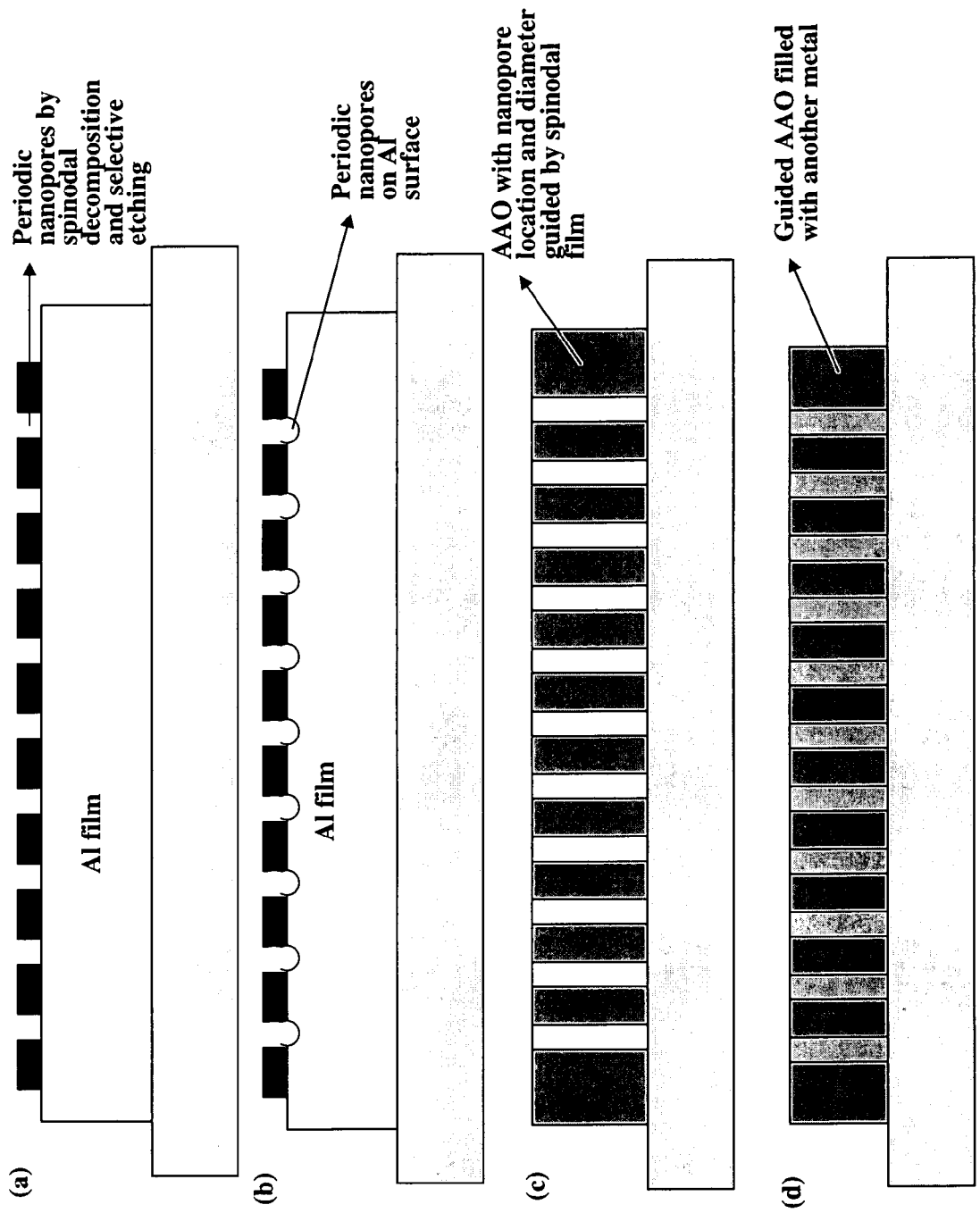

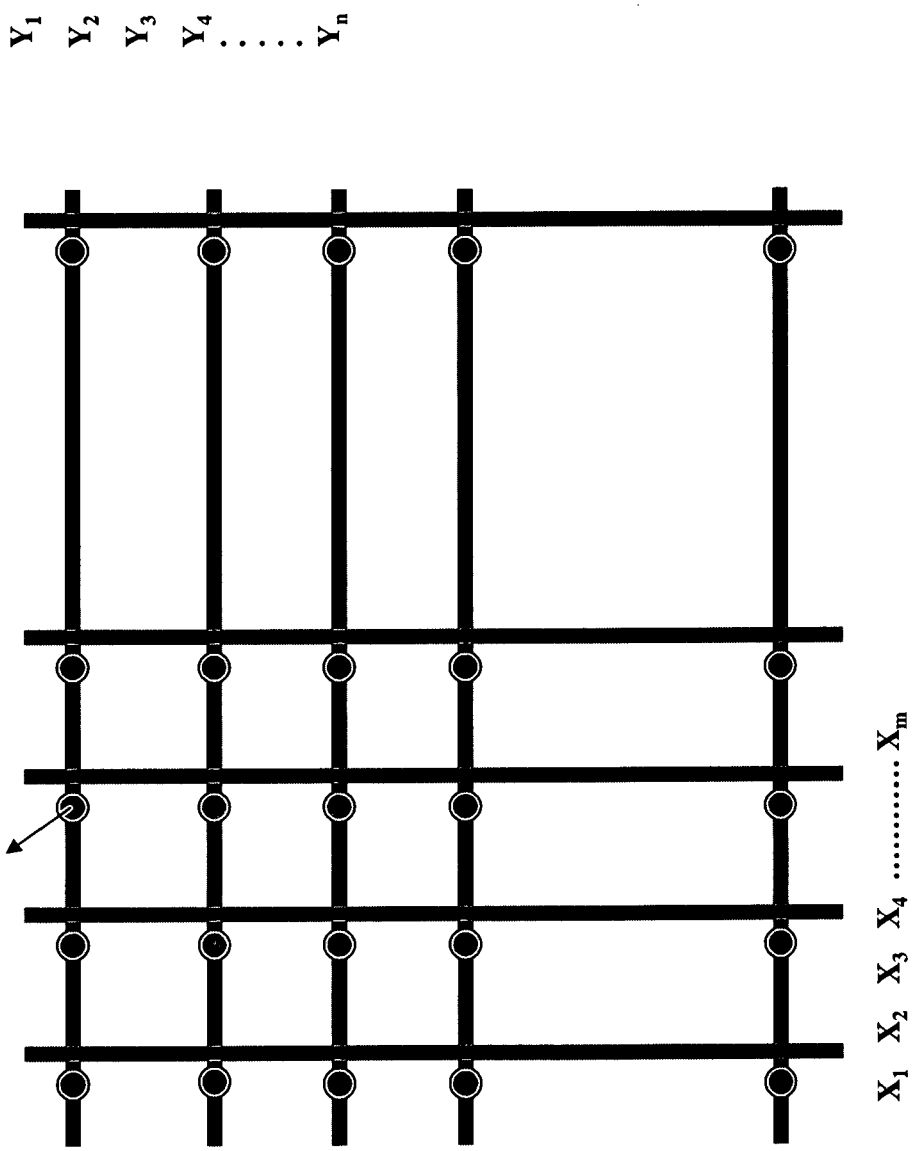

Fig. 22
Use long-range nano-island array as memory elements, switches or logic elements [Flash memory (charge storage floating gate), RRAM, Phase change RAM, MRAM, transistor array, single electron transistor, quantum computing element, etc.] Periodic island array of memory element can be placed between x-y address lines at the cross-points or slightly off the cross-point location. Insulators and other structural elements such as heaters or transistor switches may also be provided at or near each cross-point.

Charge-Storage Based, Three Dimensional Memory Using an Array of Periodically Spaced, Spinodally Created Nano-Island Storage Elements (Electrodes Not Shown)

SPINODALLY PATTERNED NANOSTRUCTURES

RELATED PATENT APPLICATION

This application is a national stage application of and claims the benefit of PCT/US2006/018138 filed on May 10, 2006, which claims the benefit of U.S. Provisional Patent Application No. 60/679,697 entitled "ARTICLE COMPRISING SPINODALLY PATTERNED NANOSTRUCTURE AND METHOD FOR FABRICATING SUCH ARTICLE" and filed May 10, 2005. Both applications are incorporated by reference as part of the specification of this application.

BACKGROUND

This application relates to microstructures with a periodic pattern and nanotechnology.

Nanofabrication is a foundation for many different types of nanotechnologies. Periodic nano-island features with the island diameter of larger than ~50 nm can be relatively easily fabricated using well established photolithography and laser lithography. However, nano island arrays with less than 50 nm feature size, even more preferentially less than 20 nm feature size, are difficult to fabricate with various lithography techniques. Electron beam lithography can be used for such fine features, however, the electron beam lithography can be slow due to the serial processing and many be costly for various large scale industrial applications.

A periodic nano element features such as nano-islands, nano-rods, or nano-cavities are useful as a basis of a variety of nanodevices including electronic, acoustic, photonic, and magnetic devices. Examples of such devices include quantum dot or single electron transistor array, photonic bandgap structures, non-linear acoustic (phononic) devices, ultra-high-density information storage media such as magnetic recording media, phase change recording media, or charge-trapping memory media, and band-gap controlled semiconductor light sources and displays, e.g., incorporating quantum well or quantum dot opto-electronic devices. For efficient addressing and minimizing of defects, interference and noises caused by interactions between adjacent nano-islands, a periodic array with identical location and spacing of nano-islands is highly desirable.

In recent years, there has been much effort to fabricate nanostructures, including nano-islands, nanowires and nano-tubes. Several approaches have been actively pursued for creation of such nanostructures, in particular, with an aim of fabricating a periodic nanostructure array. Examples of these approaches include the use of nanoscale, naturally occurring periodic-structured nano templates such as anodized aluminum oxide (AAO) membranes as a host for preparation of new nanostructure arrays, use of colloidal materials that have a surfactant type polymer matrix and inorganic nanoparticles to self-assemble into a periodic array of nanoparticles as the solvent dries up, use of a co-polymer material such as a phase-decomposed and processed diblock copolymer film for nanostructure fabrication. These and other techniques have certain technical limitations. For example, one technical limitation in some implementations of the these techniques is that the region of uniform periodic array is often very small, of the order of e.g., several micrometers or less. For many electronic, optical or magnetic products, the desired area of long-range order of periodic elements (or at least an aggregate of such long-range ordered regions) is on the order of millimeters or centimeters, which the current processing in the prior art can not reproducibly produce.

The non-periodic arrangement of such memory or logic devices or information bits increases the total number of device defects and reduces the effectiveness and usefulness of the nano-patterned device array, as it can cause undesirable electrical shorts, capacitive interactions, noises, interference with too closely located neighboring elements. In the case of magnetic hard disc media, undesirable switching or read errors of magnetically written bits (magnetized along a desired direction) can occur if the neighboring magnetic islands are too closely spaced as compared to other neighbors when the moving read/write head passes by the magnetic bits to retrieve the written information.

Two-dimensional (X-Y) addressable memories or logic devices desirably contain a periodic array of elements which perform a variety of functions. Some examples of x-y addressable functions include; i) electrical functions such as in RRAM (resistive random access memory dependent on change of electrical resistance in the elements by x-y addressing with voltage or current pulses which introduce either amorphous-crystalline phase change or interface electrical resistance change), ii) electric charge-storing functions, e.g., flash memory using storage of trapped electrical charge in floating gate elements, iii) electrical switching functions such as quantum computing quantum dot array, single electron transistor arrays, tunnel junction arrays, iv) optical functions, e.g., magneto-optical memory using laser beam writing/reading in combination with magnetic switching, or phase change material with altered optical properties induced by laser pulse heating, or quantum-dot regime luminescent devices, and v) magneto-electric functions, e.g., MRAM (magnetic random access memory). If the element in the x-y matrix array of devices are non-periodically placed, the device elements are mis-registered with respect to the x-y conductor array lines, and the devices may not be able to function in a desirable manner.

Therefore there is a need for effective processing techniques which provide desirable, long-range orders of periodically placed nano-islands, nano-particles, nano-pores, nano-compositional modifications, or nano-device elements.

SUMMARY

This application describes, among others, devices and techniques based on spinodally decomposed periodic structures for providing various nanoscaled devices, including structures and devices having long-range or an aggregate of long-range ordered, periodic nano-structures.

In one implementation, a method is described to include forming a layer to be patterned over a substrate; forming a spinodal alloy layer on the layer to be patterned. The spinodal alloy layer includes alloy elements and, when the spinodal alloy layer is at a temperature within a spinodal decomposition temperature range for the two phases formed by the alloy elements, decomposes into two phases that are spatially separated and spatially interleaved in a spinodally decomposed periodic structure. This method further includes controlling a temperature of the spinodal alloy layer to be within the spinodal decomposition temperature range to form the spinodally decomposed periodic structure; patterning the spinodal alloy layer in the spinodally decomposed periodic structure to remove one of the two phases and hence to transform the spinodal alloy layer into a patterned mask which exposes the layer to be patterned according to the spinodally decomposed periodic structure; and patterning the layer to be patterned through the patterned mask in the spinodal alloy layer to form a patterned layer.

In another implementation, a method is described to include forming a spinodal alloy layer on a substrate. The spinodal alloy layer includes alloy elements and, when the spinodal alloy layer is at a temperature within a spinodal decomposition temperature range for the two phases formed by the alloy elements, decomposes into two phases that are spatially separated and spatially interleaved in a spinodally decomposed periodic structure. This method further includes controlling a temperature of the spinodal alloy layer to be within the spinodal decomposition temperature range to form the spinodally decomposed periodic structure; and etching the substrate through the spinodal alloy layer in the spinodally decomposed periodic structure to pattern the substrate.

In another implementation, a method is described to include forming a spinodal alloy layer on a substrate. The spinodal alloy layer includes alloy elements and, when the spinodal alloy layer is at a temperature within a spinodal decomposition temperature range for the two phases formed by the alloy elements, decomposes into two phases that are spatially separated and spatially interleaved in a spinodally decomposed periodic structure. This method further includes controlling a temperature of the spinodal alloy layer to be within the spinodal decomposition temperature range to form the spinodally decomposed periodic structure; and patterning the spinodal alloy layer in the spinodally decomposed periodic structure to remove one of the two phases and hence to transform the spinodal alloy layer into a patterned spinodal alloy layer made of a remaining phase of the two phases in the spinodal alloy layer.

In yet another implementation, a method is described to include forming a spinodal alloy layer on a substrate. The spinodal alloy layer includes alloy elements and, when the spinodal alloy layer is at a temperature within a spinodal decomposition temperature range for the two phases formed by the alloy elements, decomposes into two phases that are spatially separated and spatially interleaved in a spinodally decomposed periodic structure. This method further includes controlling a temperature of the spinodal alloy layer to be within the spinodal decomposition temperature range to form the spinodally decomposed periodic structure; patterning the spinodal alloy layer in the spinodally decomposed periodic structure to partially remove the two phases by different amounts and hence to transform the spinodal alloy layer into a patterned spinodal alloy layer made of the two phases; and forming an additional structure on the patterned spinodal alloy layer.

This application also describes a method that implants metal ions into a top surface of a substrate to cause the metal ions and the substrate to react and to form a spinodal alloy layer in the top portion of the substrate. The spinodal alloy layer is configured in a way that it decomposes into two phases that are spatially separated and spatially interleaved in a spinodally decomposed periodic structure when at a temperature within a spinodal decomposition temperature range for the two phases. After the implantation of the ions, this method further includes controlling a temperature of the spinodal alloy layer within the substrate to be within the spinodal decomposition temperature range to form the spinodally decomposed periodic structure; etching the spinodal alloy layer in the spinodally decomposed periodic structure to partially remove the two phases by different amounts and hence to transform the spinodal alloy layer into a patterned spinodal alloy layer made of the two phases; and forming an additional structure on the patterned spinodal alloy layer.

Various devices and structures based on spinodally decomposed periodic structures are described in this application. For example, one of the described devices includes a substrate; a spinodally decomposed periodic structure formed over the substrate; and a periodic structure formed over the spinodally decomposed periodic structure.

Various aspects and features of devices and fabrication techniques based on spinodally decomposed periodic structures are described. In one aspect, long-range or at least locally long-range, periodically ordered arrays of discrete nano-elements such as nano-islands, nano-pores, nano-composition-variations, and nano-device-components can be fabricated using a spinodally processed alloy template coating. The spinodally patterned layer nanostructure, preferentially a monolayer, can be utilized to create a periodic nanostructure in different configurations. One configuration, for example, is to use the spinodal layer as a mask to periodically pattern another material layer underneath the spinodal layer. In this case, a deposited spinodal alloy film is first subjected to an either in-situ or separate high temperature heating for spinodal decomposition into a periodic fluctuation of composition, which is utilized as a composition-dependent mask for chemical etching or reactive ion etching to generate a sub-50 nm, preferentially sub-20 nm periodic nanofeatures in the intended material underneath the spinodal film. In another configuration, the spinodally patterned layer can be used as a template to grow one or more material layers in a periodic configuration above the spinodal layer. The resultant, spinodally patterned, periodically ordered arrays of nano-elements are useful for a variety of nanoscale devices including an array of addressable memories or logic devices, ultra-high-density magnetic recording media of either a patterned media type or a perpendicular recoding media type, magnetic sensors, ultra-high-density flash memory elements, photonic devices, quantum computing devices, quantum luminescent devices, efficient catalytic devices, and nano-implant master patterns. Such a periodic array of nano-islands, nano-cavities, or nanopores can also be utilized as a free-standing nano-mask for nano lithography using e-beam, soft x-ray beam, optical beam, ion beam irradiations for fabrication of other types of nano-features. Such a nanofeature array can also be utilized as a stencil mask for nano-deposition fabrication of nanoisland or nanowire array.

Other features described in this application are summarized as follows.

1. Nano-masks for nanofabrication—Long-range periodic array of these spinodally fabricated nano-islands is useful as nano-masks for nanofabrication. High atomic weight metals, alloys, compounds such as Au, Pd, Pt, Os, W or their alloys are preferred for use as a nanoparticle mask material for electron beam lithography, soft-x-ray lithography, extreme UV lithography, ion beam lithography, laser beam processing, implantation or reactive ion etching (RIE) as the high atomic weight metals and alloys are more resistant to penetration by electrons, x-rays, ions, or lights.

2. Magnetic recording applications—Spinodally fabricated, periodically ordered nano-island array as ultra-high-density magnetic recording media based on nano-patterned structure. High-coercivity, high magnetic anisotropy nano-islands made up of high-coercivity materials such as FePt, CoPt and rare earth cobalt compounds, or $[CoPd]_n$ or $[FePt]_n$ alternating multilayers are suitable for magnetic recording media. The resultant "patterned recording media" in one implementation can exhibit a high recording density of at least 0.2 Terabit/in$^2$ density, preferably at least 0.5 Terabit/in$^2$ density, even more preferably at least 1 Terabit/in$^2$ density in a periodic fashion over a large area of at least 0.01 mm$^2$, preferably at least 0.1 mm$^2$, even more preferentially at least 1 mm$^2$. In the patterned recording media, each stored bit of magnetic information contains only one spinodally patterned nano island, so a precise registering of the recording head with each nano island is necessary. The materials for the discrete magnetic nano-islands can be selected from high magnetocrystalline anisotropy, high coercivity materials with desired coercivity values of at least 1000 Oe, preferably at least 3000 Oe, e.g., the well known $L1_0$ phases of FePt or CoPt type intermetallic compounds, $[CoPd]_n$ or $[FePt]_n$ alternating multilayers, Co—Cr—Pt type alloy phase, Sm—Co, Nd—Fe—B, and other rare-earth alloy compounds, etc. Soft magnet underlayer (SUL) with relatively low coercive force (e.g., with a value of less than 10 oersteds, preferably less than 2 oersteds as is common with soft magnet alloys such as Ni—Fe permalloy, Fe—Co base alloys, amorphous or nanocrystalline alloys such as Fe—Co—B, Fe—Ta—N) may optionally be placed under the patterned recording media.

In the spinodally processed "perpendicular magnetic recording (PMR) media" such as $(Co—Cr—Pt+SiO_2)$ type recording media, the desired mean grain diameter of the magnetic phase such as the Co—Cr—Pt phase in one implementation can be less than ~8 nm, preferably less than 6 nm, even more preferably less than 5 nm. The recording density of the spinodally processed PMR media is at least 200 Gb/in$^2$, preferably at least 500 Gb/in$^2$, even more preferably at least 1 terabit Gb/in$^2$. The non-uniformity of grain size in the spinodally patterned PMR media, e.g., $(Co—Cr—Pt+SiO_2)$ type media is significantly reduced as compared to the standard PMR media. The desired standard deviation ratio in the spinodally processed PMR media in some implementations can be at most 15%, preferably less than 10%, even more preferably less than 7%. In the perpendicular magnetic recording (PMR) media, each stored bit of magnetic information contains at least 2 spinodally patterned nano islands, so a precise registering of the recording head with each nano island is not required, which makes a practical application of such a high-density recording media much easier.

3. Semiconductor quantum dot devices—Spinodally patterned quantum dot nanoparticles such as CdSe, CdS, CdTe, ZnS, InP, InAs, InGaAs, GaAs, GaN, and Si suitable for quantum dot devices such as LEDs (light emitting diodes), quantum laser, photosensitization apparatus such as solar cells, optical switches, photoluminescent or electroluminescent devices including displays and identification tags. A surface plasmon resonance type devices comprising nano-island or nano-pore array structure can also be fabricated by the spinodal patterning technique. Spinodally patterned, highly conductive metal nanoparticles or nanoislands, such as Au, Ag, Pt, Ni, Co in the size regime of 2-30 nm capable of producing strong and sharply defined surface plasmon resonance (SPR) emission. The photoluminescence wavelength and color of SPR nanoparticles are also controlled by their size and shape. The periodic surface plasmon resonance nanoparticle array, is suitable for luminescent devices including displays and identification tags.

4. Periodically ion implanted structure and devices—Spinodally patterned, nano-doped semiconductors with an array of periodically nanoscale implanted structure. Ion implantation of semiconductor dopants (e.g., with boron ions for p-type doping and phosphorous ions for n type doping into Si), magnetic semiconductor dopants (e.g., Mn or Co ion implantation into GaN, GaAs, $TiO_2$, Si, etc.) can be performed using the nano-island array as a periodic mask that blocks or reduces ion implantation. Nanoislands or nanopores of relatively heavy metals such as Au, Pd, Pt, Os, W are preferred for use as such a implantation mask for efficient blockage of reduction of ion penetration. For ion implantation of lighter ions such as boron or phosphorous, less heavy metal nano-islands or nano-pore array can be used. Such nanoscale (e.g., 1-50 nm. preferentially 2-30 nm scale), periodic array of nano-doped compositional variations are useful for creating new nano devices of semiconductor array, quantum dot array, field effect transistor (FET) array, spintronics device array, light emitting diode (LED) array, etc. The ion implantation method using spinodally fabricated nano-mask can also be utilized as a means of creating nanocavity features as doping of semiconductors such as Si substantially influences the chemical etch rate. Either n-type or p-type nano-doped semiconductors can be fabricated by this technique. This processing can be utilized to create periodic nano-pillar array or nano-cavity array in semiconductors. Both the nano-pillar array or nano-cavity array in semiconductors in the nanometer regime of 2-10 nm dimensional scale can be useful as luminescent devices or LED devices.

5. Nano-imprint master mask fabrication—Periodically ordered nano-island array or nano-pore array as a nano-imprint master mask prepared by spinodal patterning technique. Such a periodic ordered structure can be used as an optical grating, optically less reflective surface, or as a mold or substrate (e.g., with a thin metal or semiconductor coating) to fabricate various nano devices including actively photonic or luminescence devices, magnetic recording media and magnetic sensors, catalytic surfaces, addressable memory, switch or logic devices. An alternative embodiment of the nano-imprint application of the periodic nanostructure is to deposit nanoscale materials on another substrate to create a different types of new materials and devices. The master pattern with protruding nano-islands or nano-pillars is first dipped onto a flat pad coated with an ink or paste containing desired materials to pick up nano-quantity of the ink/paste material, and then is made to contact a flat substrate to transfer the material as nano-islands or nano-pored structure. The ink or paste can be a passive polymer, active polymer such as light emitting polymer in response to electrical or optical stimulations, or a composite of liquid polymer base and solid metal/alloy nanoparticles or metal-containing salts. In the case of the composite polymer containing metal/alloy nanoparticles or metal-containing salts, the substrate with deposited nano-island ink/paste can be baked at high temperature to burn away the polymer and leave consolidated metal/alloy or compound nano-islands. Such nano-islands can be used for various nano devices including ultra-high-density magnetic recording media, magnetic field sensor, photonic or luminescent devices including quantum dot devices, surface plasmon resonance devices, light emitting devices, energy conversion devices such as catalytic fuel cells and automobile catalytic converters, displays and identification tags, and addressable memory, switch or logic devices.

The nano-imprint master pattern described here can also be used as a lithography/etch mask for e-beam nano-lithography, soft-x-ray nano-lithography, extreme UV nano-lithography, ion beam implantation patterning, chemical etch patterning or reactive ion etch patterning to produce periodic nanofeatures.

6. Spinodally guided anodized membrane fabrication—The spinodally fabricated nano-pore structure can be used as an etch mask to create a crator in the aluminum substrate. Such etched crator nanostructures can be utilized as a guiding hole for initiation of final resolution anodization, for example, anodization of aluminum film into AAO (anodized aluminum oxide) membrane, with periodic nano-pore structure with a sub-20 nm feature size.

7. X-Y addressable electronic devices comprising the spinodally patterned nano-elements suitable for memories, switches, and logic devices. Such addressable devices comprising the periodic nanofeature array include Flash Memory (e.g., utilizing charge storage floating gate), resistance random access memory (RRAM), phase-change random access memory (PRAM), magnetic random access memory (MRAM), transistor array, single electron transistor array, quantum computing element array, etc. Each of the phase-change memory elements at cross-point of x-y addressable configuration, for example, Ge—Sb—Te alloy islands go through amorphous vs crystalline phase changes with significant changes of electrical resistance. The activation (writing) of each memory element is performed by either laser pulse or electrical current pulse. The reading of the memory bit status (e.g., 1 or 0) is performed, e.g., by electrical measurement using a lower-intensity voltage or current pulse.

8. Efficient catalyst array—The ordered nano-island array prepared by spinodal processing is also useful for enabling synthesis of periodically spaced nanowire array because each of the periodically positioned catalyst nanoparticles, for example, 1-50 nm diameter periodic Ni, Co or Fe nano-islands in periodic array on Si substrate can serve as nuclei at the carbon nanotube growth front during chemical vapor deposition from a carbon-containing gas, thus producing a long-range ordered nanotubes array. Spinodally patterned islands of other catalysts are also useful, for example Au nano-islands can be used for nucleation of various semiconductor nanodots or nanowires such as Si, GaAs, ZnO nanowires.

Spinodally fabricated, extremely fine nano-island size with guaranteed spacing (non-agglomeration) between neighboring islands, e.g., with 3 nm or smaller size, ensures availability of maximum catalyst surface area, for example, Pt, Pd, Rh nano-island array for fuel cell electrodes, catalytic converter for automobiles and other chemical/electrochemical reactions.

9. Periodic nanotubes/nanowires fabricated by spinodally created nano-island array—The periodic nano-island array can be utilized as a highly desirable seeding technique for fabrication of periodically spaced nanotubes/nanowires. There are obvious advantages of having a periodic arrangement of vertically aligned nanotubes/nanowires. Since they are equally spaced-apart, there is less probability of agglomeration of neighboring nanotubes/nanowires by van der Waal's force and other surface interactions, which provides more surface areas available for fuel cell, hydrogen storage and other catalytic applications. The reduced agglomeration of nanotubes/nanowires ensures uniformity in the aspect ratio for uniform field emission behavior. The ability to have periodic placement of nanotubes/nanowires is desirable for fabrication of x-y matrix addressable nano devices such as memory, switch and logic devices, and vertical nano-interconnections.

These and other implementations and examples are described in greater detail in the attached drawings, the detailed description and the claims.

BRIEF DESCRIPTION OF THE DRAWINGS

FIG. 15 shows an example of a two-phased vertically aligned material induced by using spinodally patterned, island array as the basis for textured or hetero-epitaxial growth, such as perpendicular magnetic recording media;

FIG. 16 shows one exemplary structure and the associated fabrication method for a single-crystal-Si-based spinodal pattern to create a two-phased vertically aligned nanostructure such as perpendicular magnetic recording media;

FIG. 17 illustrates examples of guided chemical or electrochemical precipitation on spinodally created nano island template;

FIG. 18 represents an exemplary quantum-dot-based or surface-plasmon-resonance-based photoluminescent or electroluminescent device using stimulated luminescence from an array of periodically spaced, spinodally created, more size-uniform, nano-island quantum dots;

FIG. 19 illustrates a periodically doped semiconductor nanostructure by implantation with spinodally fabricated implantation-blocking masks;

FIG. 20 schematically illustrates another exemplary process of using the spinodally created periodic nano-island array as a nano-imprint master mask for compressing on a soft, compressible substrate to create a periodic ordered nanofeature array (FIG. 20(a)-(c)), or depositing nano islands of another material as a permanent feature on a flat substrate or as a lithography/etch mask for subsequent processing to produce nanofeatures (FIG. 20(d)-(g));

FIG. 21 schematically illustrates an exemplary anodized membrane nanostructure prepared by guiding the formation of periodic and size-controllable nano-pore array via spinodally created nano-island or nano-pore array;

FIG. 22 schematically illustrates method and device for x-y addressable switch, memory or logic device comprising a spinodally fabricated nano island array;

DETAILED DESCRIPTION

Figure 1:
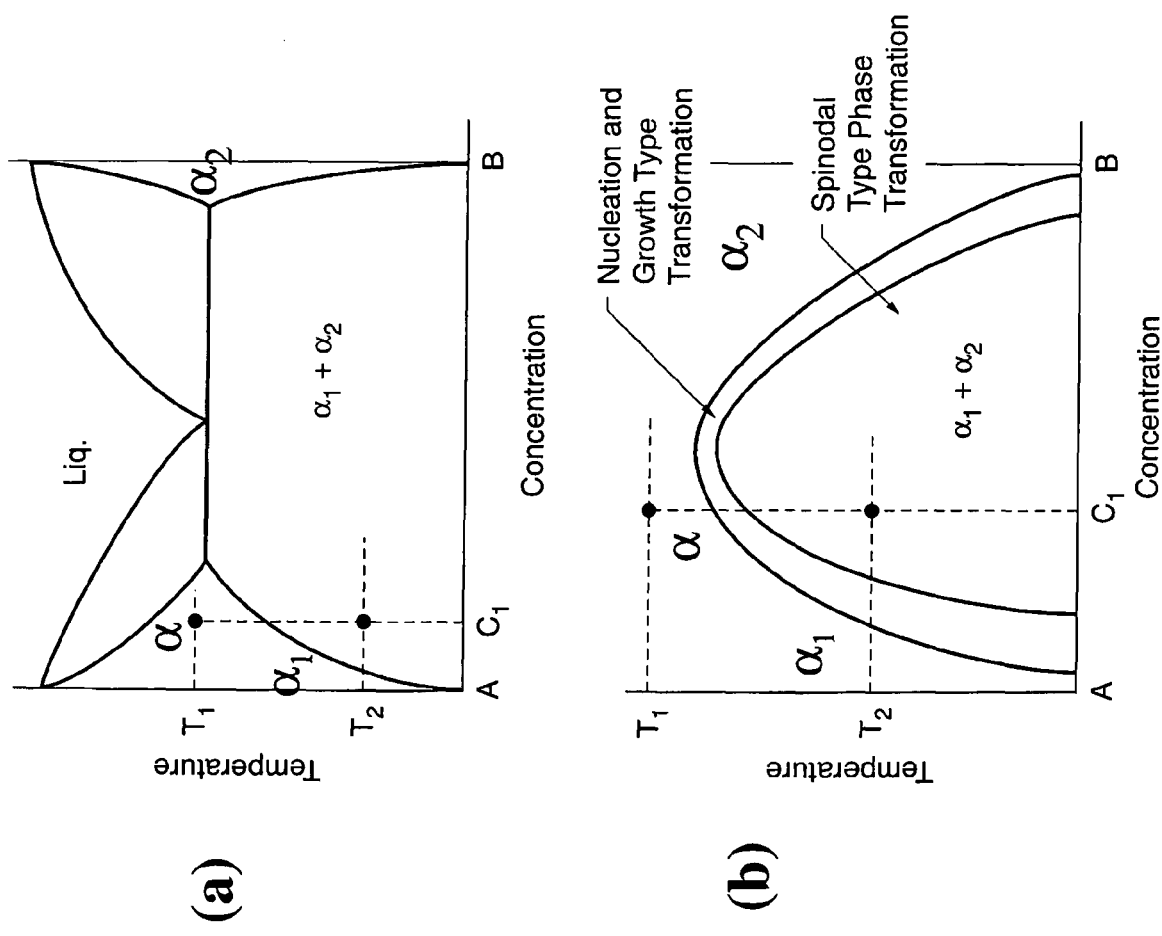
FIG. 1 schematically illustrates spinodal decomposition with binary alloy phase diagrams.

Certain materials with two or more different elements exhibit spinodal decomposition into two or more different spatially separated phases in a periodic pattern in space under proper conditions. For example, a spinodal alloy layer can be formed by two or more alloy elements and, when the spinodal alloy layer is at a temperature within a spinodal decomposition temperature range for the two phases formed by the alloy elements, the spinodal alloy layer decomposes into two phases that are spatially separated and spatially interleaved in a spinodally decomposed periodic structure. Materials capable of spinodal decomposition have been studied extensively for scientific and commercial applications. The devices and techniques described in this application use spinodally decomposed periodic structures in microfabrication and microstructures to achieve a wide range of useful features.

Examples described in this application include nanoscale structures and fabrication of long-range (or an aggregate of local long-range ordered regions), periodically arranged arrays of discrete nano-elements such as nano-islands, nano-particles, nano-pores, nano-compositional modifications, or nano-device components. In various implementations, nanoscale structures described here can have dimensions at most 100 nanometer, preferably at most 50 nm, even more preferably 20 nanometer or smaller. A feature or region in a long-range order in the described examples can have a periodic structure whose area is at least $0.01$ mm$^2$. Implementations of the described aggregate of local long-range ordered regions can have multiple long-range ordered regions of at least $0.01$ mm$^2$ size in a structure.

Implementations of periodically ordered nanostructures described in this application may include areas of predominantly periodic nano elements of at least $0.01$ mm$^2$ in size, preferably at least $0.1$ mm$^2$, even more preferably at least $1$ mm$^2$. The percentage of non-periodic defects (e.g., nano-islands, nano-particles or nano pores missing or displaced from their intended periodic positions) can be less than 20% of the total array in some implementations, less than 5% or even less than 1% within an ordered region in other implementations.

In the examples of spinodally patterned nanostructures described here, the overall dimension of the long-range ordered region can be equivalent to the size of the crystallographically oriented regions, such as each grain or textured region. Within such a region, all atoms can be essentially periodically arranged along a certain crystallographic direction, and a spinodal decomposition of such a region can produce a periodic nanostructure within the region. In the adjacent grain or adjacent region with atoms arranged along a different crystallographic direction, a spinodal decomposition can induce a periodic nanostructure within that adjacent region but with a different orientation. Therefore, in order to obtain a relatively long-range ordered nanostructure by spinodal decomposition, it is desirable that the starting material (before spinodal decomposition heat treatment) has i) either a large grain size, ii) a large area textured region, iii) or a single crystalline structure. It is well known that a long-range textured thin films can be achieved by a number of different deposition techniques, such as by using a proper combination of sputtering pressure and temperature, by employing an oblique incident deposition, or by incorporating an intermediate layer which tends to cause such a textured film instead of a random grained film. While a use of single crystal substrates which is like having a grain size equivalent to the whole substrate size, may be less practical for industrial applications because of their high cost, the use of such a single crystal starting material for spinodal decomposition can be a viable and cost-effective approach for introducing a truly long-range spinodally patterned periodic nanostructure if a relatively low-cost, single substrates such as silicon wafers are utilized. Such an ideal, long-range ordered spinodal structure is also described in reference to the FIG. 16 in which a whole wafer of ion-implanted single crystal Si wafer is utilized as a starting material for spinodal decomposition.

In the examples described in this application, the long-range order of periodic elements can be achieved by two configurations utilizing spinodal decomposition of a thin alloy layer into a nanoscale two phase structure. In the first configuration, e.g., examples in FIGS. 3-6, the spinodally decomposed film structure is subjected to selective etching of one of the phases, either by chemical etching or plasma-based etching such as reactive ion etching (RIE) so that the remaining, predominantly single phase nanostructure can serve as a mask for patterning of periodic structure on another layer material underneath. In the second configuration, e.g., examples in FIGS. 15 and 16, the spinodally decomposed film structure is utilized as a template onto which another material can be grown above the spinodal structure by physical, chemical, or electrochemical deposition. The spinodal structure can be used either in the as-deposited state, or after additional heat treatment, or after additional steps of chemical or chemical etching to induce periodic topological ups and downs (or a periodically wavy surface topology). The material deposited on this spinodal template follows the periodicity of the template and thus results in a periodic or patterned microstructure. The processes under the above two configurations are referred to as a spinodal fabrication, spinodal patterning, or a spinodal processing.

The alloy structure useful for spinodally fabricating the periodic nanostructure comprises a metallic or ceramic alloy which is capable of decomposing into at least two phases with a periodically spaced-apart nanostructure. To illustrate, FIGS. 1(a) and (b) are schematic phase diagrams showing plots of concentrations of alloy elements as a function of temperature. As can be seen, single-phase conditions of alloy elements (the α-phase) may be transformed into two-phase conditions ($\alpha_1+\alpha_2$) with appropriate heat treatments. FIG. 1(a) reflects a nucleation and growth (N&G) type transformation to a two-phased structure, which tends to be non-uniform and non-periodic, and FIG. 1(b) a spinodal decomposition structure, which is often uniform and periodic. In FIG. 1(a), a single-phased alloy system is first heat treated in the high temperature single-phase (α) region, e.g., at $T_1$. The system is then cooled to and maintained at a lower temperature in the two-phase ($\alpha_1+\alpha_2$) region, e.g., at $T_2$, which produces fine precipitates. For example, if the original alloy system comprises an alloy system of Cu—Co containing less than about 8 weight % Co, the system may be heat treated at a temperature above 650° C., and then treated at a lower temperature of about 400 to 600° C. to produce a precipitate of Co-rich particles in a Cu-rich matrix. Similar processing conditions may be applied to the Cu-rich Cu—Fe alloy system. However, being in the nucleation and growth (N&G) type transformation region outside the spinodal region, the microstructure is neither uniform nor periodic.

Figure 2:
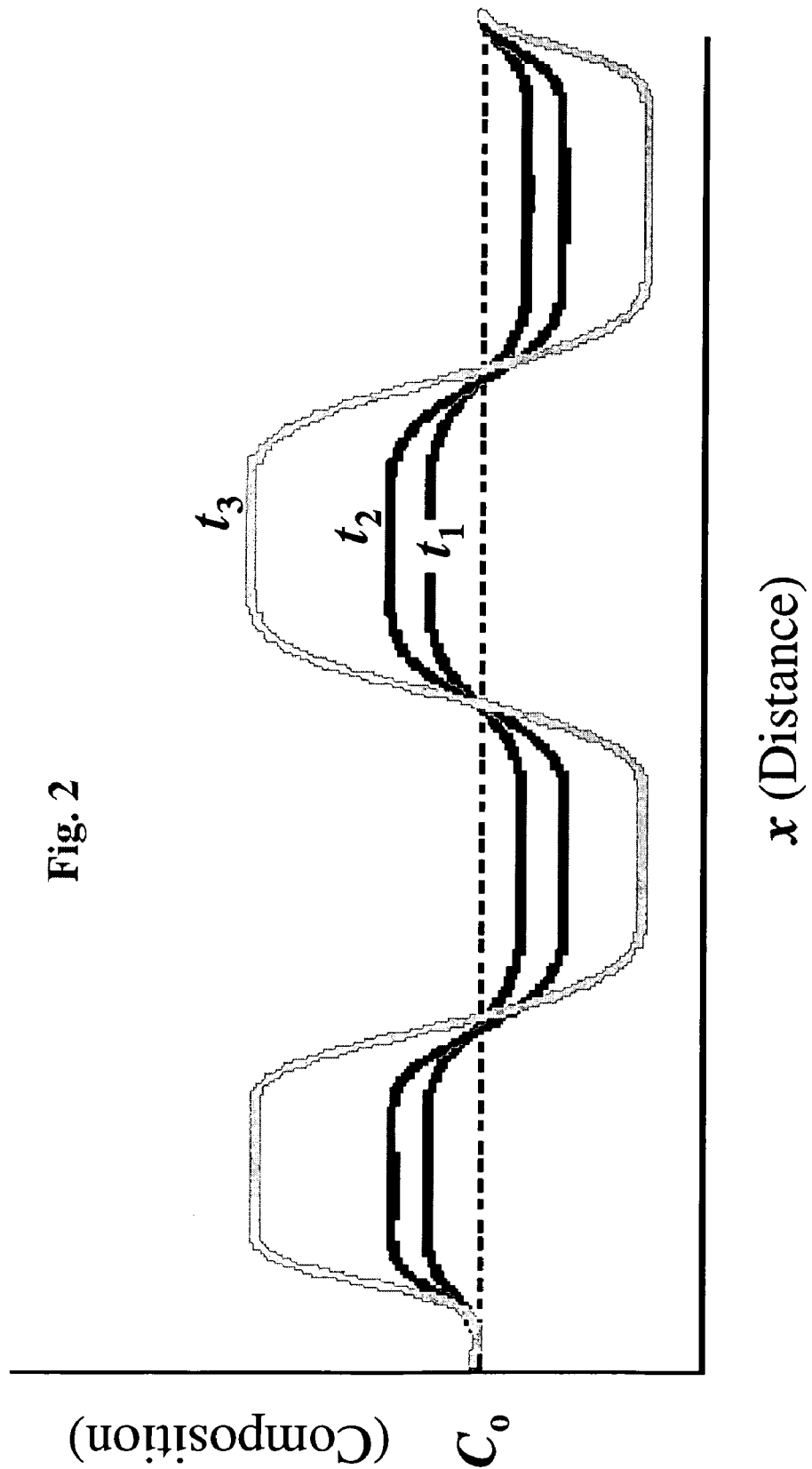
FIG. 2 illustrates time-dependent compositional fluctuations during spinodal decomposition.

FIG. 1(b) reflects a spinodal decomposition to achieve a phase separation within a spinodal miscibility gap. As reflected in FIG. 1(b), with changes in temperature, the growth of compositional modulation from the single phase ($\alpha$) region to the two-phased region ($\alpha_1+\alpha_2$) region may occur gradually from an initially homogeneous solution. At the early stage of spinodal decomposition, there is a periodic and sinusoidal compositional fluctuation. The particle size of the decomposed phase may be described in terms of "wavelength," and the compositional difference between the two phases ($\alpha_1+\alpha_2$) described in terms of "amplitude." See, e.g., an article by J. Cahn, Acta Met, vol. 10, p. 179 (1962), a book by P. G. Shewmon, *Transformations in Metals*, McGraw-Hill Book Company, New York, 1969, page 292-295, and a book by A. G. Guy and J. J. Hren, *Elements of Physical Metallurgy*, Addison-Wesley, Menlo Park, Calif., 1974, page 425-427. In spinodal alloy compositions, any small or large compositional fluctuation lowers the free energy of the alloy system. Thus, spinodal transformation occurs spontaneously and simultaneously at all locations within the alloy without having to overcome a nucleation barrier. The resultant wavelength (or particle size) is thus generally smaller, more uniform and periodic than in the N&G transformation. This uniformity and small particle size is beneficial for use as a nanoscale etch mask for another material layer underneath after one of the two spinodally decomposed phase is etched away. The particle size obtained from spinodal decomposition can be small, e.g., even less than about 5-10 nm in diameter, with appropriate selection of the alloy system and heat treatment used to induce the phase separation. As the spinodal decomposition proceeds, the initially small compositional fluctuation gradually increases with time as illustrated in FIG. 2, where t1, t2 and t3 represent three different time periods, t3>t2>t1. Unlike the N&G type transformation where the final composition of the precipitate phase is predetermined from the onset of phase transformation, the spinodal decomposition proceeds with a gradual increase of compositional difference between the two decomposing phases. Given sufficient time, the compositions of the two decomposed phases approach those of the N&G transformation with accompanying coarsening of the microstructure and loss of periodicity. Therefore, the spinodal processing should be stopped during the heat treatment at appropriate time before the loss of the desired nanoscale dimension and periodicity occurs.

Example alloy systems suitable for use for spinodal decomposition include Fe—Cr systems with a composition in the spinodal range (e.g., about 35-65 weight % Cr), Fe—Cr—Co (20-65% Cr, 1-30% Co, and balance Fe), Cu—Ni—Fe (about 15-40% Ni, 15-30% Fe, and balance Cu), Cu—Ni—Co (about 20-40% Ni, 20-40% Co, and balance Cu), Au—Ni (about 20-80% Ni). There are other spinodal alloys which can also be utilized for various described implemetiaons, such as AlNiCo magnet alloys (Fe—Al—Ni—Co alloys), Cu—Ni—Sn alloys, Cu—Ni—Ru, Al—Zn, Al—Si alloys, and others.

Because of different chemistry of the two separated phases in spinodally decomposed alloys, they exhibit different etch rate on chemical or RIE etch, thus can result in a periodic island or cavity structure. The alloy film is first deposited on the material surface to be nano-patterned, for example, another layer of thin film of a non-spinodal material or the substrate itself. The deposition of thin films, both the spinodal alloy film and the material layer to be nano-patterned below the spinodal alloy film, can be carried out using well known deposition techniques such as physical vapor deposition (e.g., DC sputtering, RF sputtering, ion beam deposition, thermal or electron-beam evaporation) or chemical deposition (e.g., chemical vapor deposition, electrodeposition, electroless deposition).

In some implementations, the spinodal alloy film is subjected to a phase-separation process (e.g., high temperature heat treatment) such that a uniform and periodic spinodally decomposed microstructure is formed. For example, a spinodal alloy consisting of Fe-28% Cr-10.5% Co is subjected to a temperature regime within a spinodal region of ~400-650° C., either by heating to a temperature and holding or passing through this temperature range on cooling from a higher temperature, the alloy decomposes into a two phase structure consisting of a (Fe,Co)-rich phase and a Cr-rich phase. See articles by Jin et al., *IEEE Trans. Magnetics, MAG*-16, 139 (1980) and *IEEE Trans. Magn. MAG*-23, 3187 (1987). If the deposition of the spinodal alloy film is carried out on a heated substrate, or using a RF sputtering technique at a relatively high power, the alloy film is heated and spinodal decomposition occurs during the film deposition. In these cases, the post-deposition heating step can be omitted.

Figure 3:
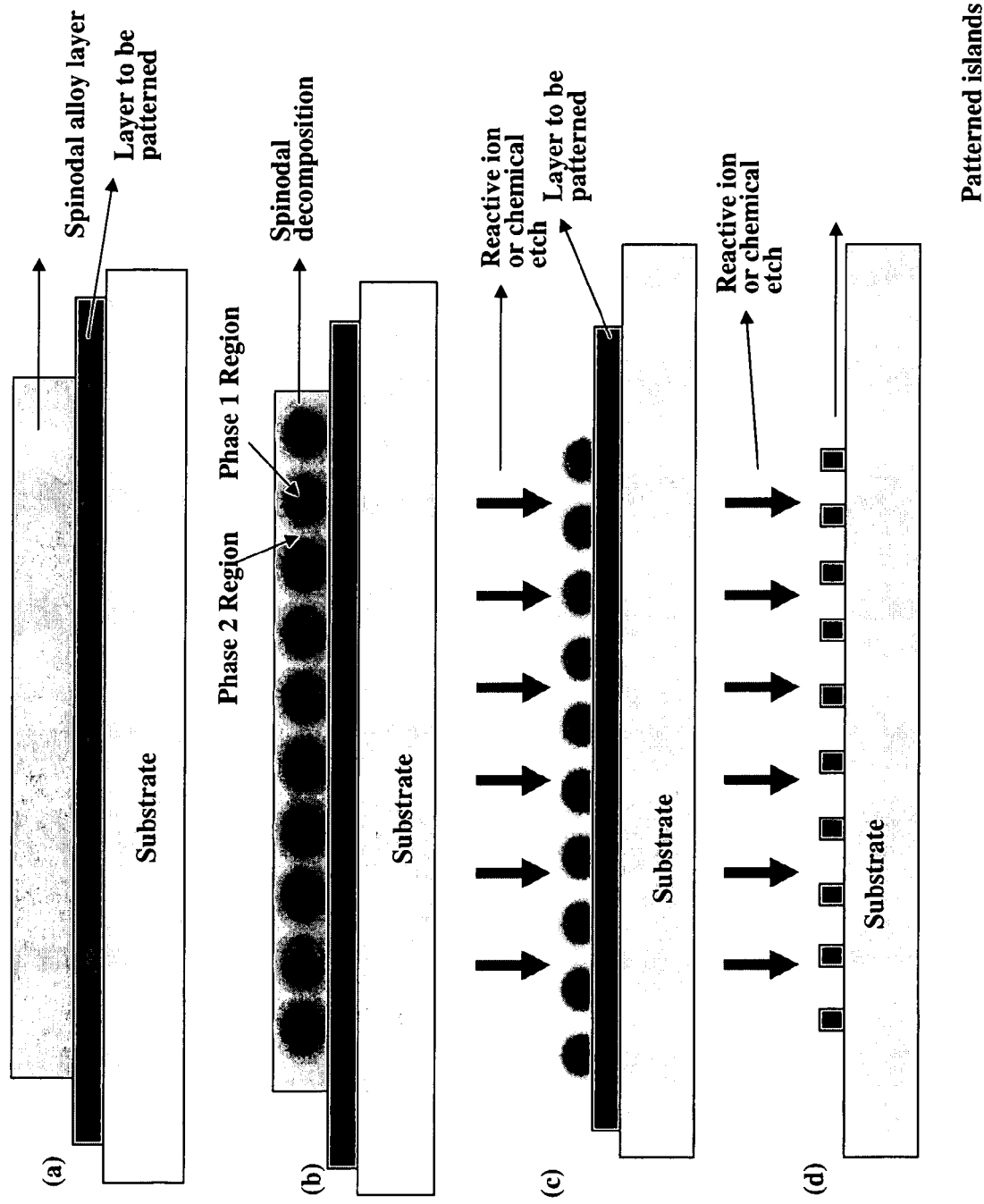
FIG. 3 schematically illustrates one exemplary process of forming patterned, periodic islands by nanoscale spinodal decomposition of an alloy film in combination with preferential etching of one of the spinodally formed phases.
Figure 4:
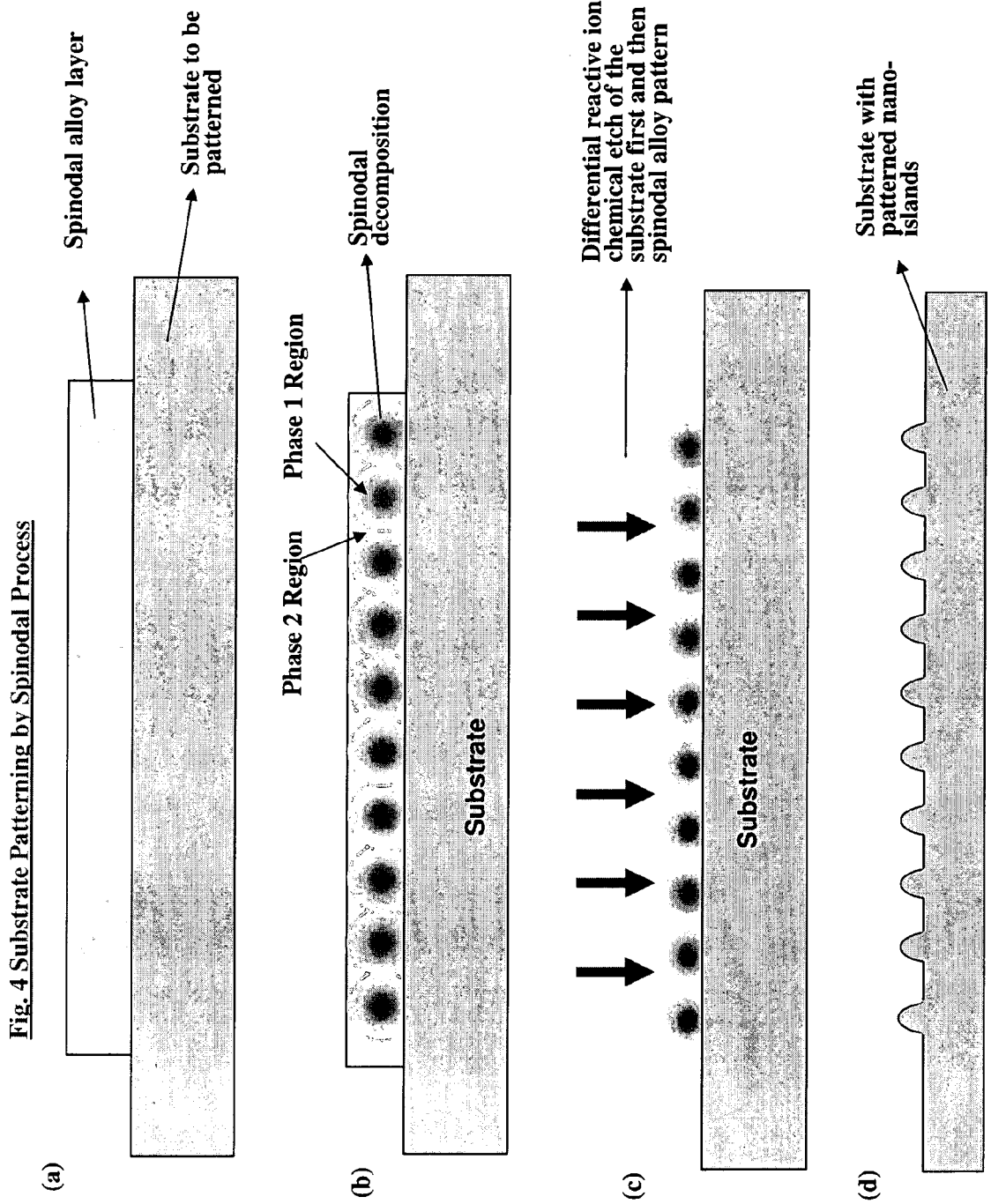
FIG. 4 schematically illustrates the spinodal nanoisland array patterning of substrate using coated and spinodally decomposed film with selective etching process.

With regard to the process of periodic pattern formation using a spinodal structure, the drawing of FIG. 3 schematically illustrates an example for a process of nano-patterning using a spinodal alloy film as a etch mask. On a flat substrate (such as Si, GaN, GaAs, InP, quartz, glass, sapphire, $LaAlO_3$, $LiNbO_3$, $SrTiO_3$, MgO, etc.), a layer of material to be nano-patterned is deposited, e.g., by sputtering, evaporation, or electrodeposition, as illustrated in FIG. 3(a). The desired thickness of the layer is in the range of 1-50 nm, preferably in the range of 2-20 nm. This material can be a metal, alloy or ceramic film. For example, a layer of FePt magnet alloy film may be formed by sputter deposition and heat treatment at ~600° C. for formation of the $L1_0$ high-coercivity phase, for subsequent spinodal nano-patterning into a nano-island array for ultra-high-density patterned magnetic recording media. Another example is the deposition of a quantum dot material layer such as CdSe or InAs to be patterned into a periodic nano-island configuration. Next, a layer of spinodal alloy is deposited on top of the layer to be nano patterned, FIG. 3(a). The desired thickness of the spinodal layer is in the range of 1-50 nm, preferably in the range of 2-20 nm. The spinodal alloy film is then heat treated (or in-situ heated during the film deposition) for decomposition into nanoscale, periodically arranged two phase structure, FIG. 3(b), with the heat treating temperature, time, and the mode (isothermal annealing below the spinodal temperature vs continuous cooling from above the spinodal temperature) selected so as to desirably form an array of patterned, periodic islands. Depending on which of the two decomposed phases is more resistant to chemical or RIE etching, the resultant structure can be either a nano-island array or nano-pore array. Once the nano-island or nano-pore structure is formed in the spinodal layer, a chemical or RIE etching, FIG. 3(c), results in nano patterning of the layer underneath into desirable periodic nano-island configuration, FIG. 3(d). The substrate itself can also be patterned in a similar manner as illustrated in FIG. 4. Depending on the relative chemical or RIE etchability of the two spinodally decomposed phases, a nano-pore array, instead of a nano-island array, can be fabricated as shown in FIGS. 5 and 6.

Figure 5:
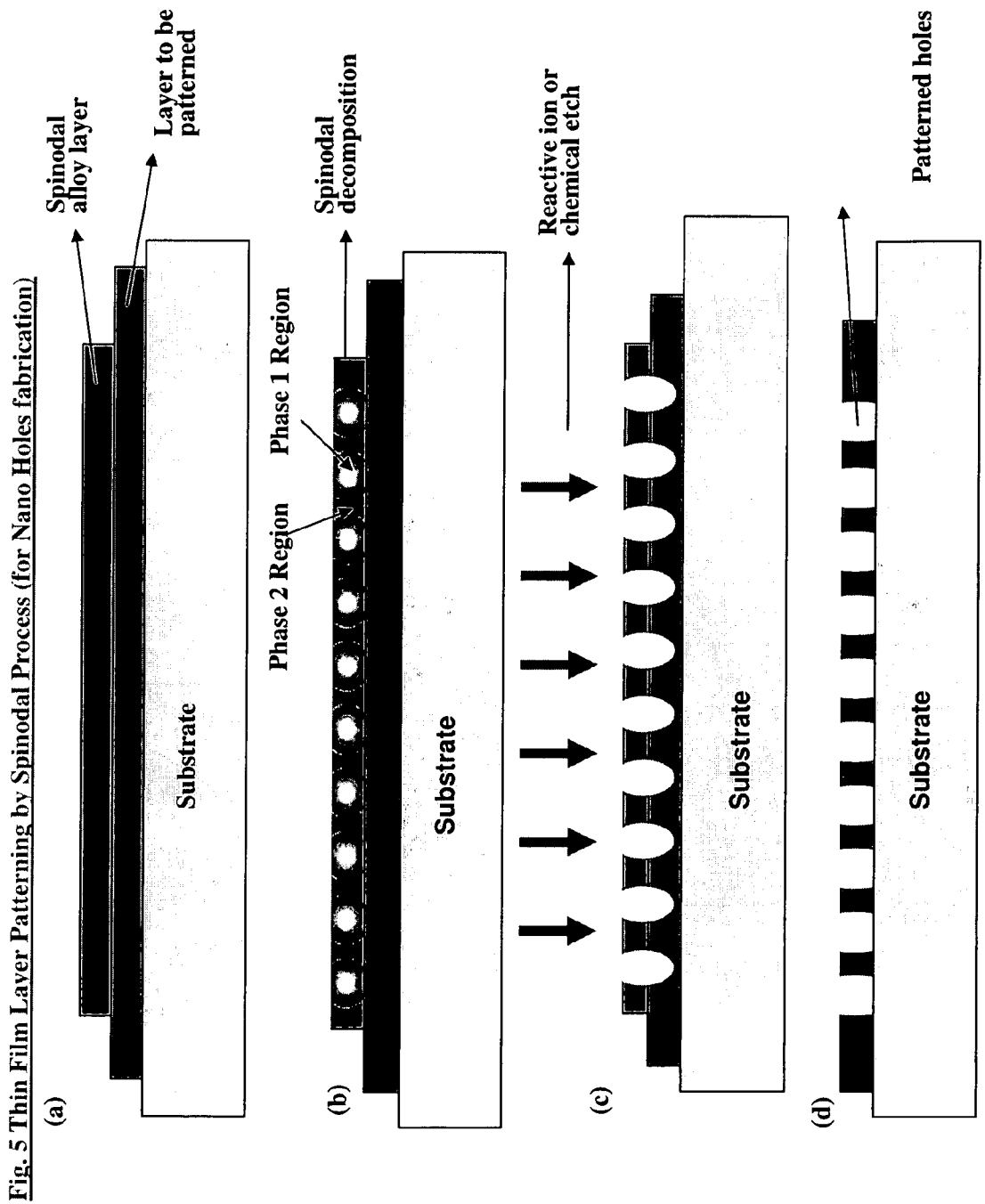
FIG. 5 schematically illustrates one exemplary process of forming patterned, periodic nanopores by nanoscale spinodal decomposition of an alloy film in combination with preferential etching of one of the spinodally formed phases.
Figure 6:
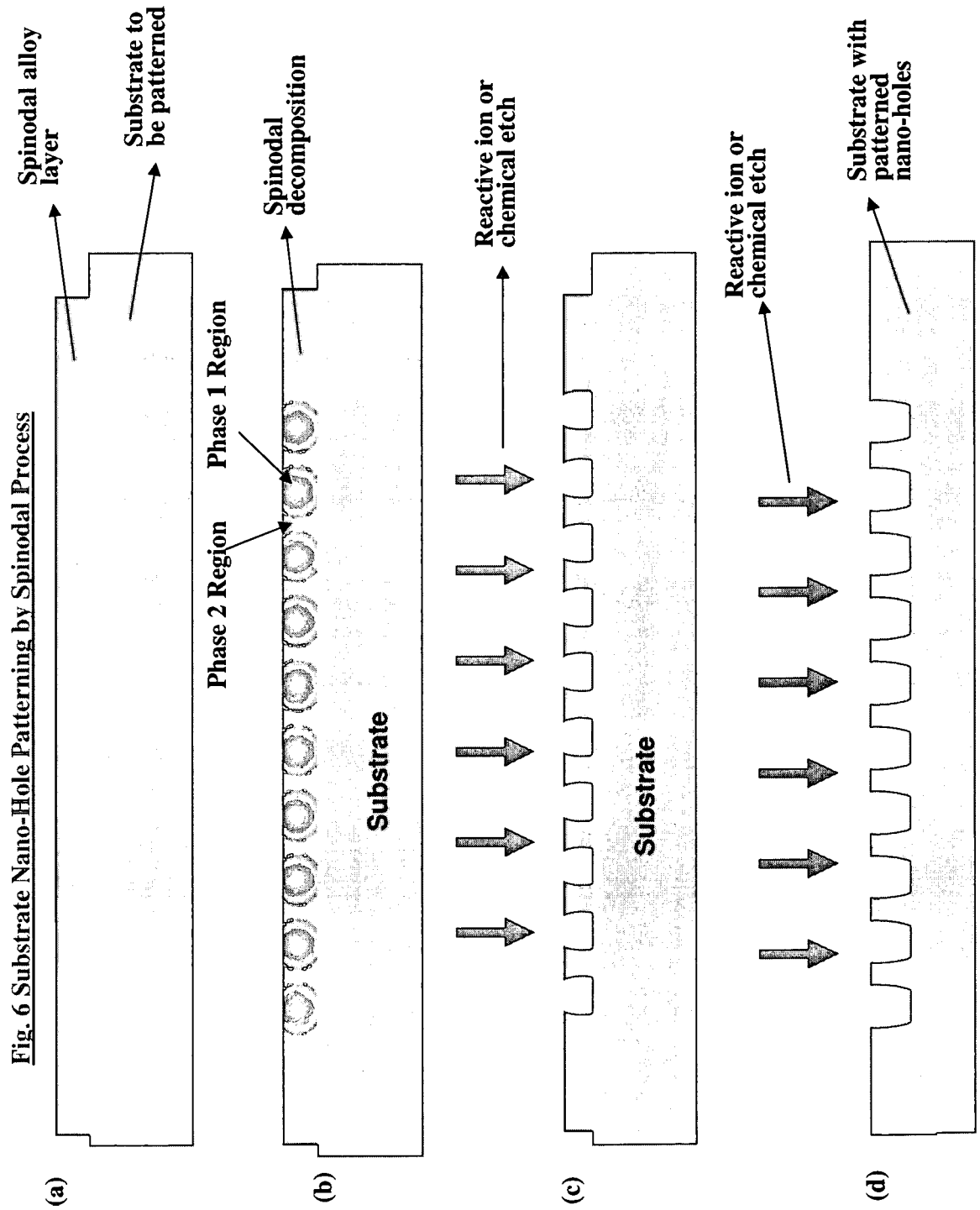
FIG. 6 schematically illustrates the spinodal nanopore patterning of substrate using coated and spinodally decomposed film with selective etching process.
Figure 7:
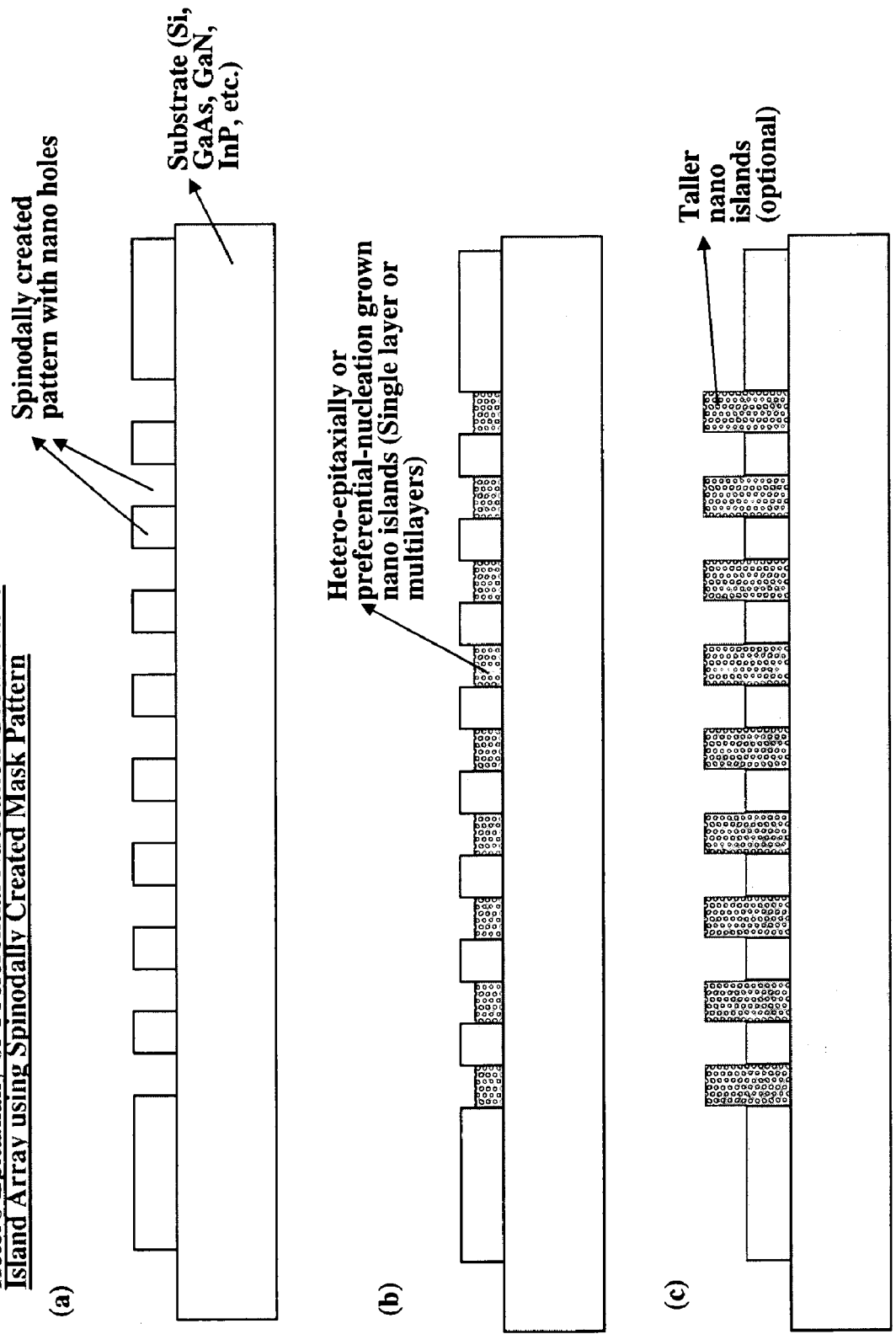
FIG. 7 schematically illustrates heteroepitaxial or preferential-nucleation growth of desired nano-island array material either within the nanopores in spinodally decomposed and etched nanopore mask pattern or within another periodically nanopored material created by using spinodal processing.
Figure 8:
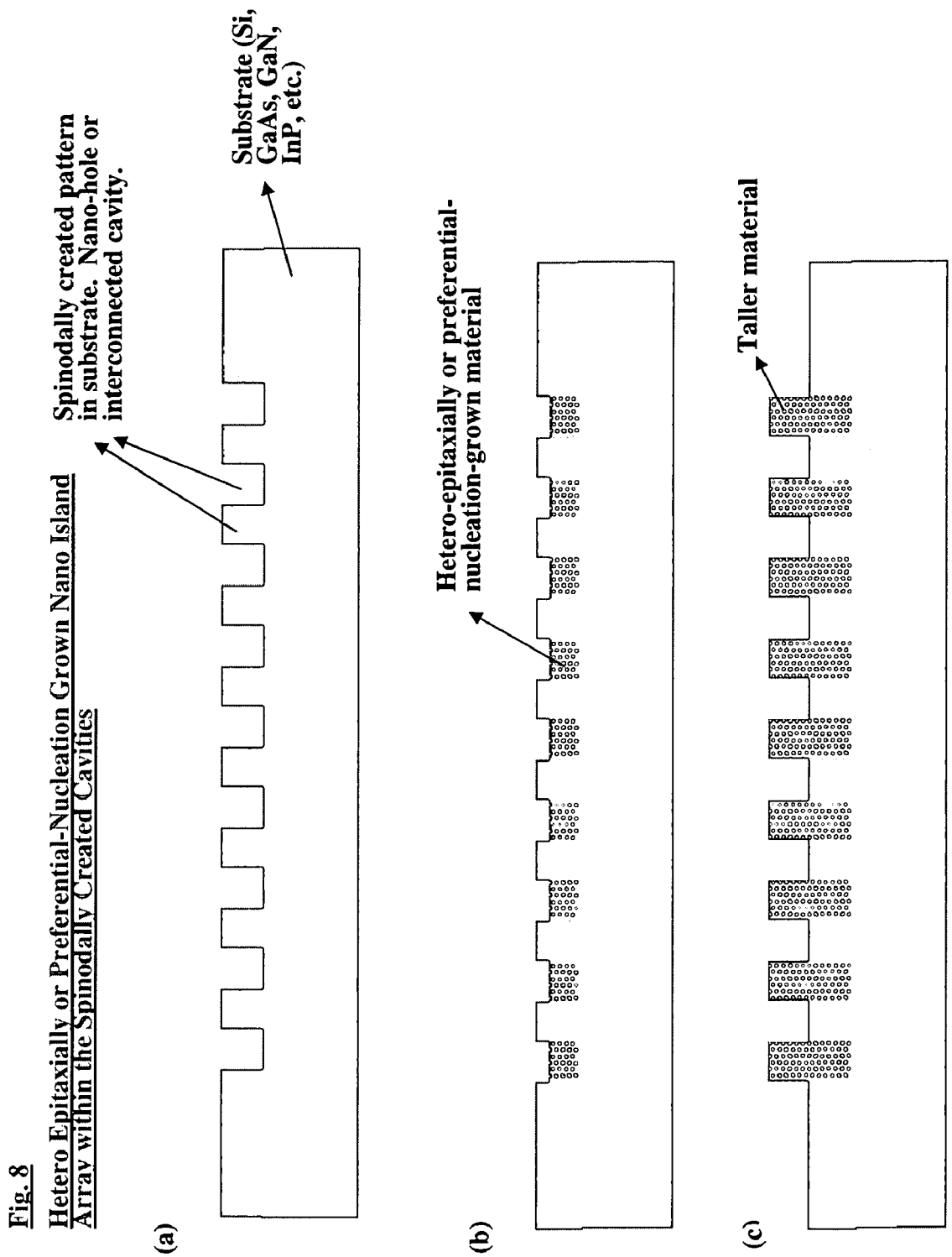
FIG. 8 schematically illustrates heteroepitaxial or preferential-nucleation growth of desired nano-island array material within the spinodally created periodic nanopore array in a substrate.

Once the nano-pore arrays such as those shown in FIGS. 5 and 6 are formed, additional nanostructures can be constructed. One example is to use the protruding portion (ridges) of the spinodally patterned substrate of FIG. 6, or a spinodally patterned, pre-deposited non-magnetic underlayer of FIG. 7, and deposit a thin film of high coercivity magnetic information storage material. The desired magnet materials include FePt, CoPt, CoCrPt-type materials, rare earth cobalt compounds (such as $SmCO_5$, $Sm_2CO_{17}$, $Nd_2Fe_{14}B$), and $[CoPd]_n$ or $[FePt]_n$ alternating multilayers. The magnetic layer deposits not only on the ridges but also at the bottom of the valleys. However, because of the closer distance to the read or write head to the ridge area magnetic films than the valley area films, the magnetic island material on the top of the ridge effectively serves as isolated magnetic bit islands, and thus constitutes a patterned media. The deposition of the magnetic layer on the ridges can be carried out by either sputtering, evaporation, chemical vapor deposition, or electroless or electrochemical deposition. In the case of electroless or electrochemical deposition, the surface tension of the liquid will tend to minimize the penetration of electrolyte solution into the valley area, thus producing a preferential deposition on the ridges than the valleys. Another example of utilizing the spinodally patterned ridge-valley structure of FIGS. 5 and 6 is illustrated in FIGS. 7 and 8, where epitaxial or preferential-textured growth of another phase is induced within the periodic and equal-diameter nano-pores. Such a small and uniform diameter features can be useful for formation of quantum dots or patterned magnetic recording media. In quantum dot materials, the bandgap engineering is critically dependent on the size of the quantum dots. Semiconductor materials such as silicon, GaAs, InAs, InGaN can be made to exhibit photoluminescence and electroluminescence at selected wavelengths for light emitting diode (LED) or laser devices if their size can be altered. Being able to provide uniform and small size quantum dot array as illustrated in FIGS. 7 and 8 means desired control for emission color as well as the sharpness of a given LED or laser emission wavelength.

Figure 9:
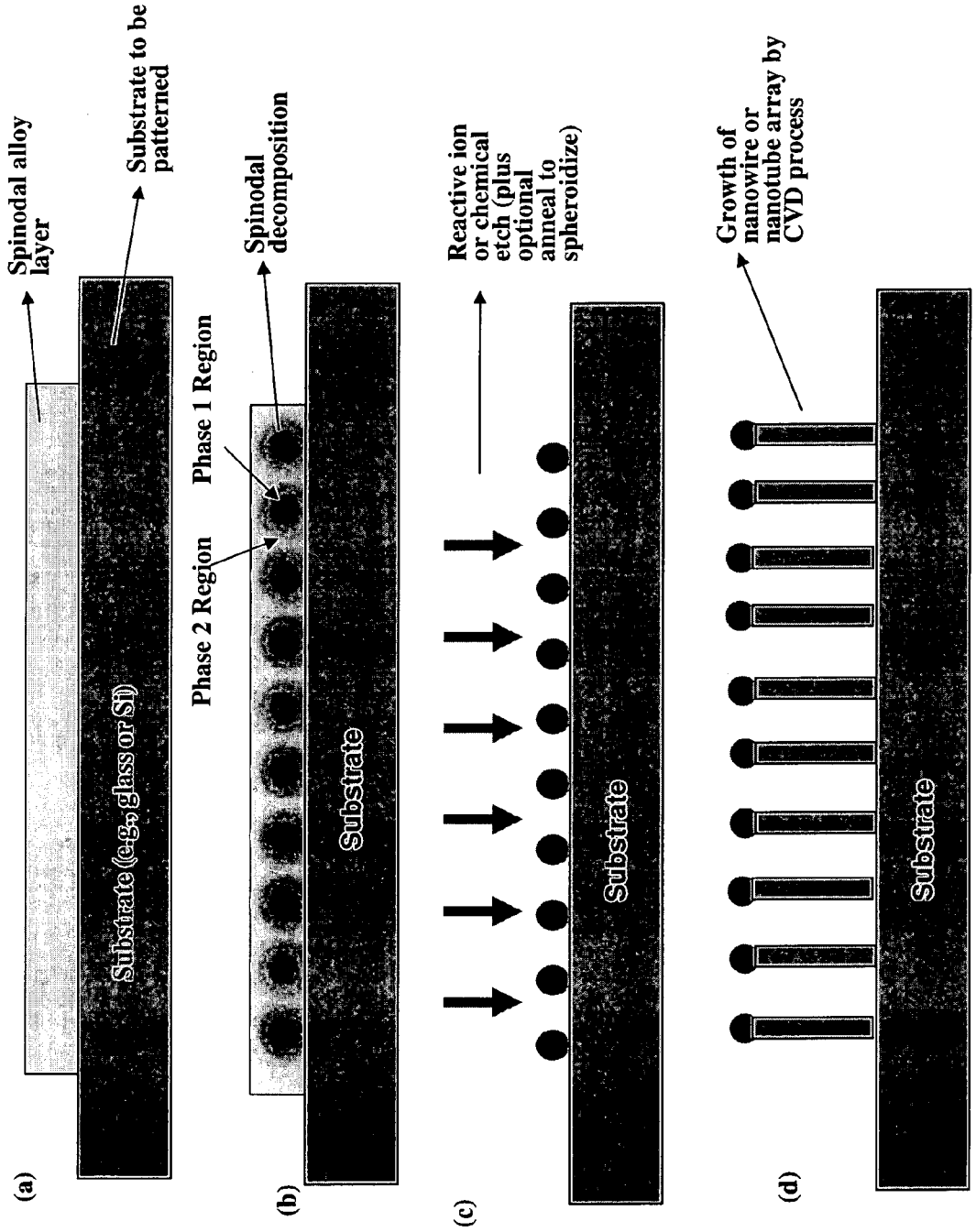
FIG. 9 illustrates a periodic array of nanotubes or nanowires created by chemical vapor deposition processing using spinodally processed periodic nano-island array of catalysts.

The spinodally fabricated nano-island array can also be useful for subsequent fabrication of a variety of nano-islands, nanowires or nanotubes if the nano-patterned material is selected to be a catalyst material or template material for subsequent growth of another type of material in a patterned configuration. These examples are illustrated in FIGS. 9-16. In the case of the spinodally patterned nano islands serving as catalyst particles for nanowire or nanaotube synthesis, e.g., during chemical vapor deposition (CVD), the particles can either move together with the growing nanowires or nanotubes (commonly known as the tip-growth mechanism in carbon nanotube growth), or can stay attached on the substrate and allow the nanowires or nanotubes to get longer (generally referred to as the base-growth mechanism in carbon nanotube growth). The case of the particles moving with the growing nanowires/nanotubes is illustrated in FIG. 9 where a spheroidizing annealing process may be applied to modify the geometric shape of the patterned features. Cobalt, nickel or iron based, or their alloy based nano-islands created by the spinodal processing can be utilized for nucleation and growth of carbon nanotubes, with an advantage of well-selected and uniform nanotube diameter and spacing. For example, Cu—Ni—Fe spinodal alloys spinodally decompose to Cu-rich phase and (Ni,Fe)-rich phase. If the Cu-rich phase is preferably chemically etched (as Cu is much easier to etch with dilute acid than Ni or Fe), the remaining (Ni,Fe)-rich phase will ball up to islands or particles during heating to the CVD temperature for carbon nanotube growth (typically, 600-900° C.), and serve as the catalyst particles for nucleation and growth of carbon nanotubes in the presence of hydrocarbon gas. Thermal CVD process which utilizes the high temperature as the means for cracking the hydrocarbon gas such as acetylene or methane. Plasma enhanced CVD process such as using DC plasma, RF plasma, or microwave plasma may also be used to facilitate the decomposition of the hydrocarbon for carbon nanotube nucleation. Gold-rich catalyst nano islands created by the spinodal processing can be utilized for CVD synthesis of Si or ZnO nanaowires with more uniformly sized and more uniformly spaced configuration.

A variation of the FIG. 9 processing is to deposit first on the substrate a well-known, nanotube- or nanowire-nucleating catalyst metal layer (such as Ni, Fe, or Co film for the case of carbon nanotube growth, or Au film for the case of ZnO or Si nanowire growth). A spinodal alloy layer is then added on top of the catalyst metal layer, and the spinodal patterning such as illustrated in FIG. 3 and FIG. 5 is carried out to produce an array of islands of the catalyst material.

Figure 10:
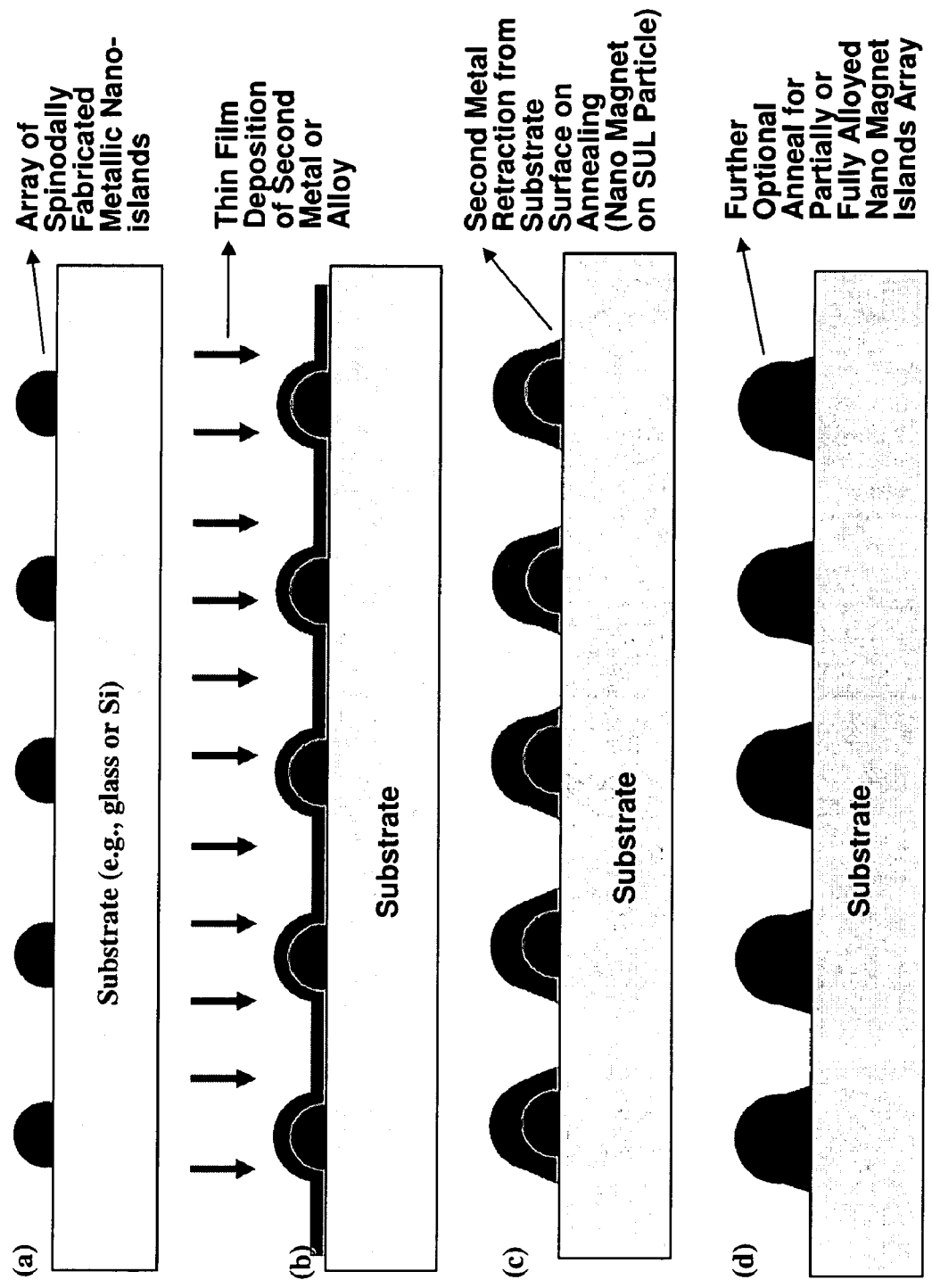
FIG. 10 schematically illustrates (a) spinodally processed periodic nano-island array, and (b)-(d) various types of composite nano-island array built on the periodic nano-islands.
Figure 11:
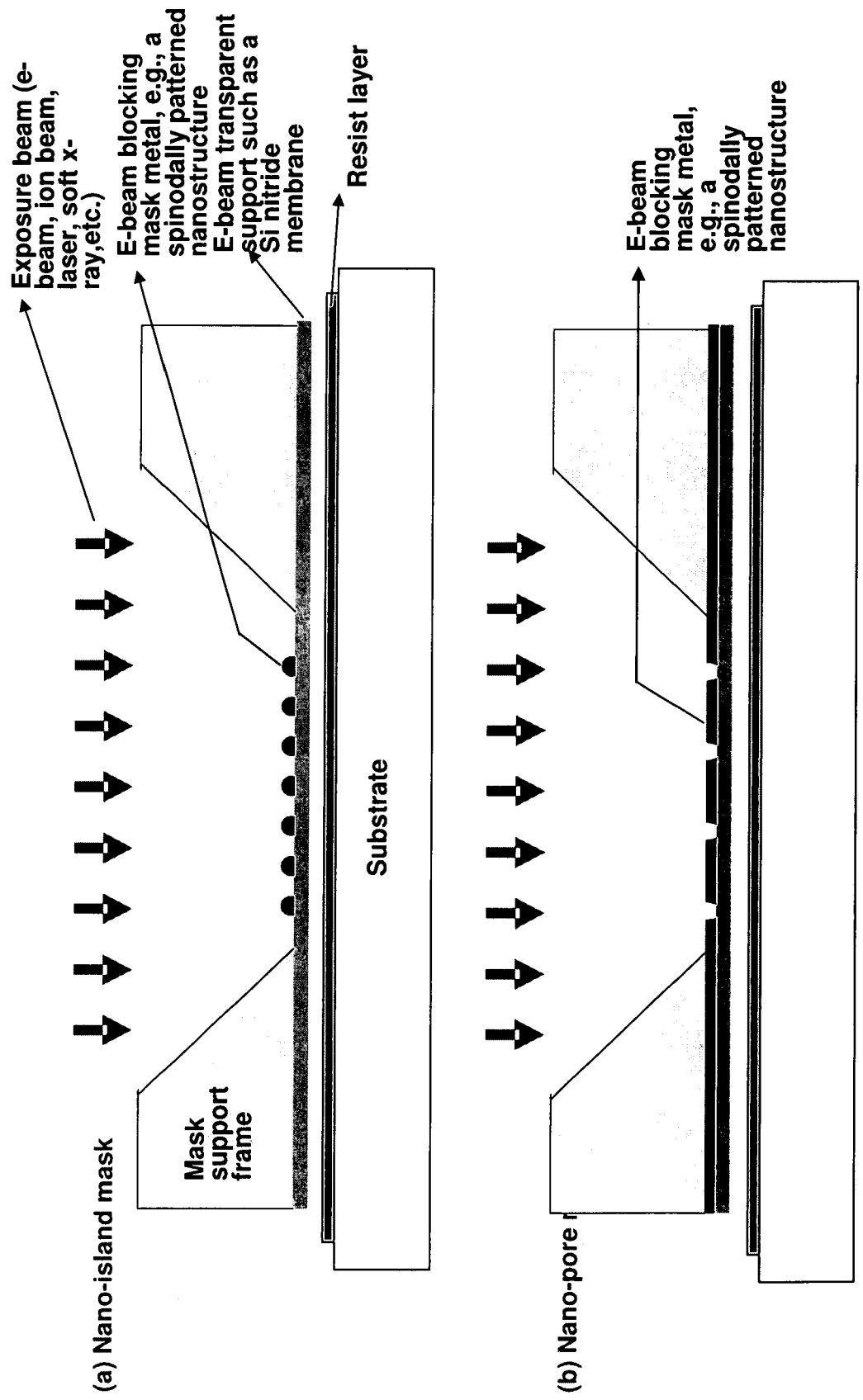
FIG. 11 illustrates nano-lithography technique using a mask of (a) spinodally-produced, e-beam blocking nano-island array, and (b) spinodally-produced nano-pore array with the array supported by beam-transparent membrane.

The spinodally fabricated nano-islands can also be the basis of creating composite material nano-island array as illustrated in FIG. 10. On top of such a nano-island array (FIG. 10(*a*)), a layer of different material (e.g., a metal, alloy, ceramic, polymer, etc.) is deposited by physical or chemical means, FIG. 10(*b*). Such a protruding nanostructure can be useful for applications where higher surface area is needed, for example, as a catalytic surface. Such a protruding surface with rounded top geometry also provides a reduced-contact-area to minimize friction, so it can be useful as a low-friction surface. Such a protruding nano-island configuration also reduces wetting by a liquid, so it can be utilized as anti-wetting surface for devices or products. If the coating material with intrinsically low friction coefficient or hydrophobic characteristics is selected, such as teflon, the anti-friction or anti-wetting characteristics can even be further improved.

The shape of the coated material in FIG. 10(*b*) can be altered by subsequent annealing. If the coated film is metallic, high temperature annealing can cause the coated layer to retract, especially if the coating metal or alloy is selected in such a way that it does not react with the substrate surface. For example, if the substrate surface is silicon oxide or glass, and if the metal is a noble metal such as gold, silver, or platinum, which does not easily wet the oxide surface, the coated metal will retract and ball up on annealing as illustrated in FIG. 10(*c*). Upon further annealing, a partial or complete alloying between the nano-island metal and the coating metal can occur, as shown in FIG. 10(*d*). For example, the spinodally fabricated nano islands of FIG. 10(*a*) can be Fe or Co, while the coating applied onto the nano islands can be Pt. An annealing heat treatment, typically 300-1000° C. for 0.1-10 hrs allows sufficient diffusion of Fe and Pt to eventually form the high-coercivity L1o phase nano islands.

One example of useful application based on the nanostructure of FIG. 10(*c*) or (*d*), is nano-patterned magnetic recording media. The nano-island material can be one of the spinodally decomposed phases left over after chemical or RIE etching. A Cu—Ni—Fe spinodal alloy, for example, decomposes into Cu-rich phase and (Ni,Fe)-rich phase. Since Cu is etched away by acid much faster than (Ni,Fe) phase, a proper etching process leaves mostly (Ni,Fe)-rich phase nano-islands, as illustrated in FIG. 10(*a*). The (Ni,Fe)-rich phase is generally magnetically soft. A deposition of a thin film layer of high-coercivity permanent magnet material such as FePt, CoPt , Sm—Co, etc. as illustrated in FIG. 10(*b*) followed by appropriate annealing process, creates a protruding magnet nano islands of FIG. 10(*b*) or (*c*) configuration, which itself can serve as a nano-patterned magnetic recording media. Since the (Ni,Fe) soft magnet nano-island is directly under the hard magnet FePt, CoPt or Sm—Co bump, this is ideal hard-magnet/soft-magnet combination with the soft-magnet nano-island serving as a magnetic SUL (soft underlayer) which makes magnetization of recording bits somewhat easier. Upon further annealing, the (Ni,Fe) underlayer will react with the FePt bumps, with an eventual formation of FeNiPt type $L1_0$ phase nanomagnets, FIG. 10(d).

The islands formed on the substrate shown in FIG. 10(a) may be achieved in different ways using the spinodally patterned periodic structures. One example is to use the process shown in FIGS. 3(a)-3(d) where a layer is patterned into islands by using the patterned spinodal layer as a mask but the patterned spinodal layer is removed at the end of the process. Another example is to use the process shown in FIGS. 6(a)-6(c) where one of the two phases in the patterned spinodal layer is used to form the final islands. The periodic nano-island arrays described here can be used in a variety of applications. Some examples are provided in the following sections. Other application are certainly possible based on the examples described here.

i) Nano-Masks for Nanofabrication

Figure 12:
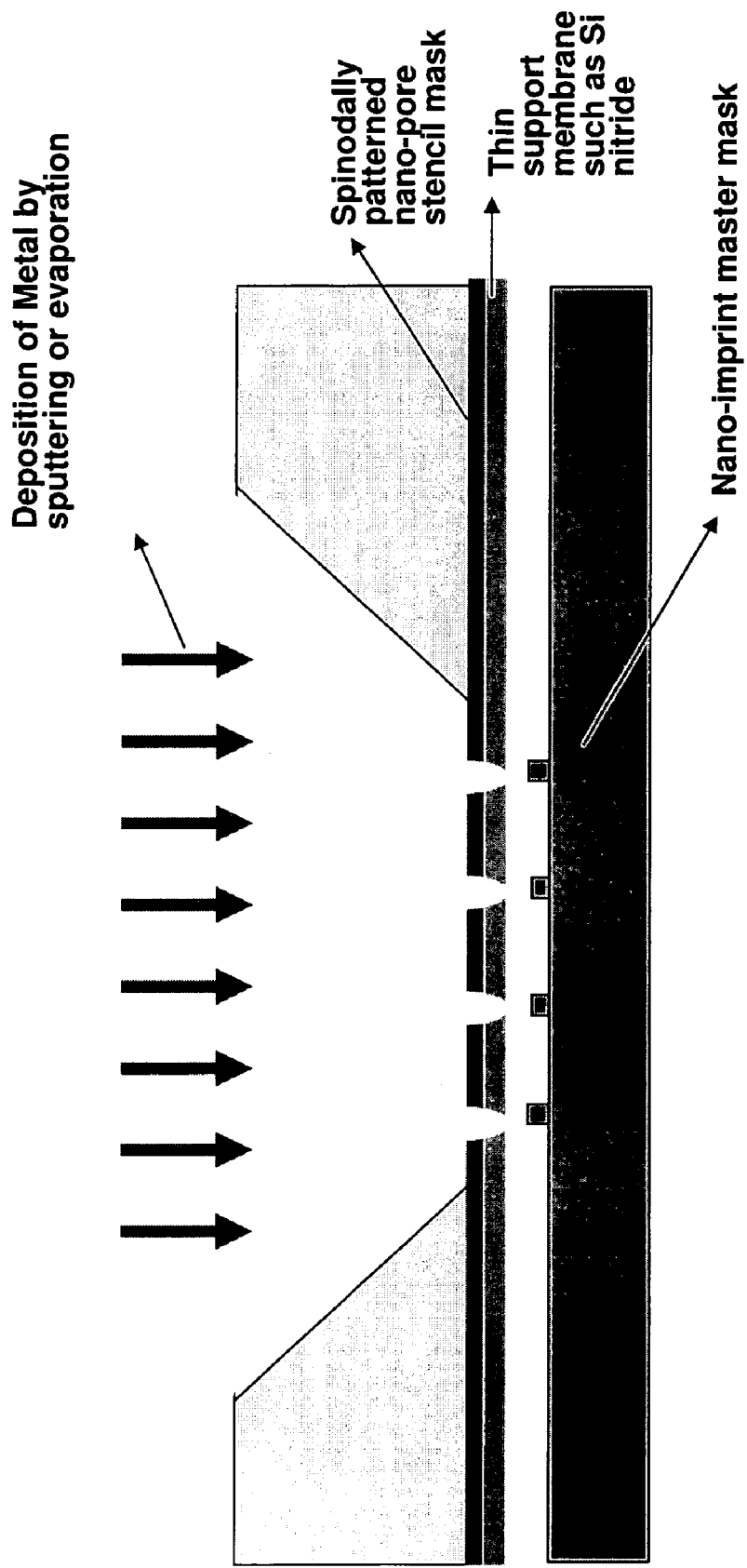
FIG. 12 represents a schematic illustration of a technique to fabricate nano island array or master nano-imprint mask by physical vapor deposition of another material through the periodic holes in a spinodally created stencil mask.

Periodic array of these spinodally fabricated nano-islands is useful as nano-masks for nanofabrication. High atomic weight metals, alloys, compounds such as Au, Pd, Pt, Os, W or their alloys are generally preferred for use as a nanoparticle mask material for electron beam lithography, soft-x-ray lithography, extreme UV lithography, ion beam lithography, laser beam processing, implantation or reactive ion etching (RIE) as the high atomic weight metals and alloys are more resistant to penetration by electrons, x-rays, ions, or lights. First, a layer of the heavy metal is optionally deposited on an electron-transparent membrane support such as Si-nitride or diamond-like carbon membrane, which is often commercially available as a support membrane for transmission electron microscopy. Next, a spinodal alloy film is deposited and in-situ or post-deposition annealed to form a spinodally decomposed pattern, which is then chemically or dry reactive ion etched to form a nano pattern following the spinocal microstructure. The spinodally patterned nanostructure (either the spinodal alloy itself in the absence of the heavier metal, or a layer of heavier metal which is patterned following a spinodal alloy pattern deposited above and processed) can be utilized as the exposure blocking mask as illustrated in FIG. 11(a). Alternatively, a spinodally fabricated nano-pore array layer can be placed on an electron-transparent membrane support such as Si-nitride or diamond-like carbon, and used as an exposure mask as illustrated in FIG. 11(b). The electrons will perform a preferential exposure on the regions of the e-beam resist underneath the open hole areas of the spinodally fabricated exposure mask. The spinodally fabricated nano-pore array can also be utilized as a stencil mask for thin film deposition, for example, as illustrated in FIG. 12, so that a nano-island array can be deposited through the open holes in the stencil mask. Since a prolonged deposition will block the nano-pores on the mask, a care should be taken to deposit such a nano-pore mask only for limited amount, for example, to fabricate nano-islands for an implant master mask.

ii) Magnetic Recording Applications

Figure 13:
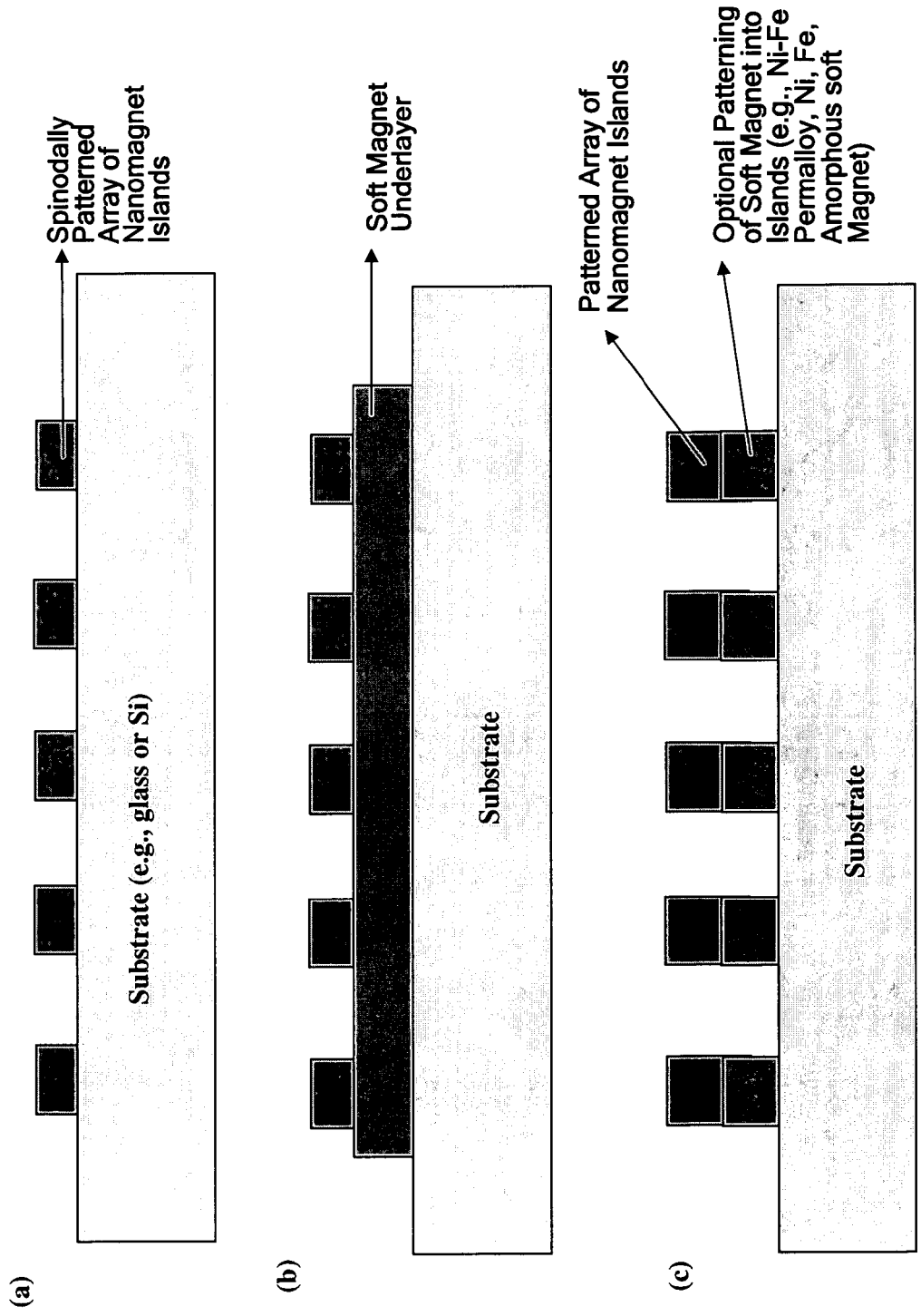
FIG. 13 illustrates various possible embodiments of spinodally created ultra-high-density patterned media of magnetic recording without or with soft magnetic underlayer.

Another type of major application for spinodally fabricated, long-range ordered nano-island array is the ultra-high-density magnetic recording media based on a nano-patterned structure, as illustrated in FIG. 13. Such a nano-patterned structure can be utilized for either as "patterned magnetic recording media" in which each nano-patterned element is magnetized as one memory bit, or as "perpendicular magnetic recording (PMR)" media in which typically several of the grains or nano elements are magnetized as one memory bit.

High-coercivity, high magnetic anisotropy nano-islands made up of high-coercivity materials such as FePt, CoPt, CoCrPt-type materials, rare earth cobalt compounds (such as $SmCO_5$, $Sm_2CO_{17}$, $Nd_2Fe_{14}B$), and $[CoPd]_n$ or $[FePt]_n$ alternating multilayers are among the suitable magnetic materials to be spinodally patterned. The CoCrPt-type materials as well as $[CoPd]_n$ or $[FePt]_n$ multilayers have an advantage of having the desirable vertical anisotropy and high coercive force without having to apply a high temperature annealing as is required for the case of the L1o type intermetallic compound films of FePt or CoPt. The characteristics and fabrication techniques for thin film of these materials are well established in the prior art, for example, see articles by B. D. Terris et al, Journal of Physics D, Vol. 38, page R199-R222 (2005), by J. H. Judy, Journal of Magnetism and Magnetic Materials, Vol. 287, page 16-26 (2005), by R. H. Victora et al., Journal of Magnetism and Magnetic Materials, Vol. 235, page 305-311 (2001), by N. J. Speetzen et al., Journal of Applied Physics, Vol. 97, page 10N118 (2005), and by G. Hu et al, Journal of Applied Physics, Vol. 97, page 10J702 (2005). In order to accomplish such spinodally patterned magnetic recording media, the desired magnetic alloy layer is thin film deposited on a flat substrate such as a glass, silicon or silicon oxide, and then is given either in-situ or post-deposition annealed if necessary to achieve the magnetic compound or alloy phase with desired high coercivity. A spinodal alloy film is then deposited, for example, using an alloy selected from a list of Cu—Ni—Fe, Cu—Ni—Co, Fe—Cr—Co, Fe—Al—Ni—Co, Cu—Ni—Sn, Cu—Ni—Ru, Al—Si, Al—Si—Co, Au—Ni, and Al—Zn described earlier. The alloy film is then given in-situ or post-deposition annealing at a desired temperature of e.g., 25-700° C. to form a periodic spinodal microstructure. The thickness of the spinodal alloy film is selected in such a way that the spinodally decomposed nanostructure is of the mono layer type microstructure. Typical desired thickness of the spinodal alloy layer deposited is in the range of 2-10 nm, which can easily be deposited by known physical or chemical deposition techniques.

Modern magnetic recording media benefits from the presence of a soft magnetic underlayer (SUL) material beneath the hard magnetic recording layer because the SUL can serve as a part of magnetic flux return path and make the magnetization of the hard magnet bit easier. Spinodally created islands for ultra-high-density patterned recording media can be utilized either with no SUL (soft magnetic underlayer), on SUL, or on pattern SUL (by RIE or chemical etch) as described in FIGS. 13(a), 13(b) and 13(c), respectively.

It is widely recognized that the current longitudinal magnetic recording (LMR) technology for hard disk drive (HDD) is approaching its fundamental superpapramagnetic limit and will be replaced with a new type of recording media called "perpendicular magnetic recording (PMR)" media which exhibit generally much higher recording densities of in excess of ~100 gigabits per square inch of area ($Gb/in^2$). PMR media based HDD products has already been introduced to the market. The PMR technology is expected to push the areal density up to 500 $Gb/in^2$ or above if the structure and the properties of the PMR material are improved. For general background and state of the art progress, see articles by M. L. Plummer, et al, in a book, "The Physics of Ultra-High Density Magnetic Recording", Chapter 8, Springer (2001), by H. J. Richter, Journal of Physics D: Appl. Phys. Vol. 32, page R147-R168 (1999), by A. Moser, et al., Journal of Physics D: Appl. Phys. Vol. 35, page R157-R167 (2002), by R. Wood, et al., Journal of Magnetism and Magnetic Materials, Vol. 235, page 1-9 (2001).

In the PMR recording method, unlike a conventional LMR method, each of the magnetic information unit bits to be recorded in a medium are magnetized in a direction perpendicular to a substrate, which provides fundamental advantages of data stability partly due to the magnetization along the vertically elongated small bits. PMR medium is composed of three major layers including the recording layer where magnetic data is written, the intermediate layer which serves as a template layer for growing high quality, vertically-textured recording layer, and the soft underlayer (SUL) which is placed between the intermediate layer and substrate, playing the role of enhancing the writing field strength as well as field gradient via imaging the magnetic recording head in the SUL layer itself.

From the recording media perspective, the basic requirements for achieving high density HDD is to obtain high signal to noise ratio (SNR) and low bit error rate (BER) at high recording densities by reducing the media noise while maintaining the large signal amplitude that can be detected by magneto-resistive read head. The media noise of PMR disk comes not only from the recording layer but also from the SUL. In order to reduce the medium noise from recording layer, the grain structure of the recording layer needs to be controlled to provide magnetically decoupled small grains with narrow grain size distribution while maintaining the sufficient perpendicular magnetic anisotropy for ensuring the data stability of written bits. On the other hand, the SUL induced medium noise can be suppressed by preventing the formation of domain wall inside the SUL layer because it is well known that the domain wall itself can generate the unintended magnetic signal and also disturb the position of the magnetic transition during writing process through the magnetic interaction with recording layer.

The Co—Cr—Pt based PMR media, often fabricated by sputtering technique, typically and desirably exhibit a vertically microstructure consisting of high-coercivity, vertically textured Co—Cr—Pt grains embedded/separated by the silicon oxide wall. As there is a substantial variation in the Co—Cr—Pt grain diameter, each magnetization bit written for information storage is designed to incorporate several grains for the sake of read/write consistency and uniformity of information bit. However, if the grain diameter is made more uniform, each memory bit can contain a fewer number of grains and still provide a bit-to-bit uniformity, which would desirably result in a higher recording density. The typical mean grain diameter in the prior art Co—Cr—Pt type PMR media is known to be in the regime of ~7-8 nm. The non-uniformity of grain size in such PMR media as expressed by the ratio of standard deviation divided by the mean diameter, and is of the order of 18-20%.

Figure 14:
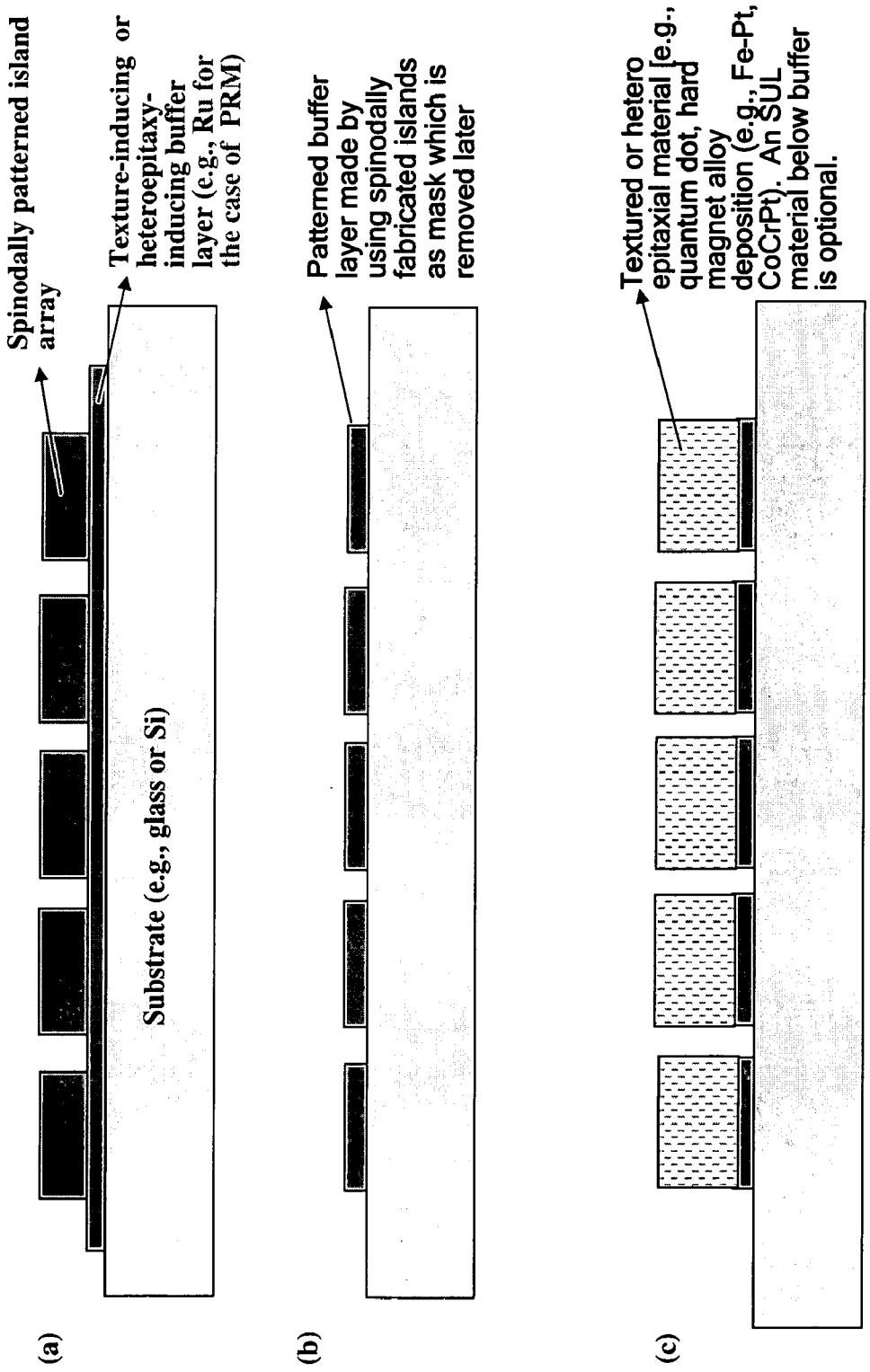
FIG. 14 shows one exemplary periodic array of vertically textured or hetero-epitaxial growth of another material on spinodally patterned, periodic array of buffer layer (seed layer) such as for creating ultra-high-density patterned magnetic recording media.

In the spinodally processed PMR media, as illustrated in FIGS. 14-16, the mean grain diameter of the magnetic phase such as the Co—Cr—Pt is desirably less than ~8 nm, preferably less than 6 nm, even more preferably less than 5 nm. The recording density of the spinodally processed PMR media is at least 200 Gb/in$^2$, preferably at least 500 Gb/in$^2$, even more preferably at least 1 terabit Gb/in$^2$. The non-uniformity of grain size in the spinodally patterned PMR media, e.g., (Co—Cr—Pt+SiO$_2$) type media is significantly reduced as compared to the standard PMR media. The desired standard deviation ratio in the spinodally processed PMR media, in some implementations, can be at most 15%, preferably less than 10%, even more preferably less than 7%.

The spinodal fabrication technique can also be utilized to create a nano-island pattern of a buffer layer which is employed to induce a textured or heteroepitaxial growth of another material on top. As illustrated in FIG. 14, such a periodic array of buffer layer islands can induce a similarly patterned magnetic layer to serve as a patterned recording media, or a next generation, higher-density perpendicular recording media. While a number of different materials can be fabricated as illustrated in FIG. 14, an example material that can be grown in such a way is the magnetic recording media material such as FePt, CoPt type L1$_o$ phase materials, [CoPd]$_n$ or [FePt]$_n$ alternating multilayers, or CoCrPt type perpendicular magnetic recording media. A preferred buffer material for the PMR media is ruthenium (Ru) which is known to play a role of inducing the desirable c-axis texture in the sputtered CoCrPt grains. In FIG. 14, the spinodally patterned Ru islands help nucleate and grow more uniform-sized CoCrPt grains. The high coercive force magnetic material can be selectively deposited on the patterned buffered layer island region as illustrated in FIG. 14, e.g., by using selective electrochemical deposition, electroless deposition, chemical vapor deposition, or stiction-coefficient-dependent, preferential adhesion of sputtered or evaporated atoms.

Alternatively, a co-deposition approach can be utilized to form a vertically aligned nanocomposite structure using the spinodal patterning of FIG. 14 (the composite structure not shown in FIG. 14). For example, in the case of perpendicular magnetic recording (PMR) media, the ferromagnetic material (CoCrPt) can be co-deposited together with a non-magnetic separation layer material (magnetic isolation layer). Each of the CoCrPt vertical grains is separated by a non-magnetic oxide such as SiO$_2$, Al$_2$O$_3$, or MgO. An addition of soft underlayer (SUL) material below the buffer is optional.

Shown in FIG. 15 is an example for a process where the spinodal layer is used as a template to build additional periodic structures thereon. In this example, the spinodally decomposed, geometrical periodicity of waviness or protrusions is directly utilized as a template to grow more uniform-sized nano islands or nano composites of another material, for example, a perpendicular magnetic recording (PMR) media of (CoCrPt+SiO2), comprising CoCrPt magnetic material grains separated by SiO$_2$ spacer. Either an as-deposited spinodal alloy film or a partially post-deposition-etched film (e.g., by RIE etch or chemical etch) may be used as the template to grow the PMR media. A suitable spinodal alloy material to be used as the texture-inducing template layer include Fe—Cr—Co, Fe—Cr, Cu—Ni—Fe, Cu—Ni—Co, Cu—Ni—Ru, Al—Si, Al—Si—Co. The substrate material can be either a glass or silicon. The use of a soft magnetic underlayer below the spinodal layer is optional. Other high coercivity magnetic materials may be similarly co-deposited to form a PMR media, for example, by co-sputtering of (FePt+SiO2) or (CoPt+SiO2).). The spinodally patterned perpendicular magnetic recording media can have vertically aligned, high coercive force material grains embedded and isolated by surrounding vertical walls made up of non-magnetic and insulating material. More specifically, the high coercive force materials can be selected from a variety of high magnetocrystalline anisotropy, high coercivity materials with desired coercivity values of at least 1000 Oe, preferably at least 3000 Oe., e.g., the well known L1$_0$ phases of FePt or CoPt type intermetallic compounds, [CoPd]$_n$ or [FePt]$_n$ type alternating multilayers, Co—Cr—Ta—Pt type alloys, Sm—Co, Nd—Fe—B, and other rare-earth alloys. The non-magnetic and insulating material can be selected from oxides such as Al$_2$O$_3$, SiO$_2$, TiO$_2$, ZrO$_2$, Cr$_2$O$_3$, and other transition metal oxides or rare earth oxides, from nitrides such as Si$_3$N$_4$, AlN, BN, Nb$_2$N, TaN, TiN, VN, ZrN. Other non-magnetic insulators such as carbides, fluorides, iodides, borides may also be utilized as the isolation wall material. Co-sputtering of one of these non-magnetic materials together with one of the high coercivity magnetic materials using either a composite target or more than two separate is one of the preferred fabrication method to form a periodic nanostructured PMR material using the spinodally patterned template as the substrate.

Alternatively a reactive sputtering technique, e.g., sputtering of metallic target or targets in a gas atmosphere containing oxygen, nitrogen, carbon, fluorine, or boron is an alternative PMR layer fabrication technique. The desired PMR layer thickness is typically less than 50 nm, preferably less than 20 nm.

In another implementation, the spinodally fabricated waviness or protrusion nanostructure can be used as a geometrically periodic and more uniform template but add a texture-inducing Ru coating on top of the waviness before growing the PMR material on top. Ru has a similar hexagonal close packed crystal structure and has a good lattice match with cobalt which is the base metal of the CoCrPt media. Other texture-inducing coating may also be applied on top of the spinodally shaped surface of FIG. 15.

Referring to the drawings, FIG. 16 schematically illustrates a creation of single-crystal-Si-based spinodal pattern for periodic magnetic structure with a deposited metal or alloy layer (e.g., Al or Al alloy) for thermal reaction with single crystal Si to form surface spinodally decompose-able composition. Physical vapor deposition, chemical vapor deposition, or chemical, electrochemical deposition, or ion-implantation of metal (e.g., Al) can be utilized to form a spinodal composition near the top surface, through subsequent thermal reaction of the added metal atoms with single crystal Si. The spinodally decomposed structure is then processed in various ways as described earlier for spinodal patterning. The spinodally patterned surface can, if desired, be utilized as a geometrical or heteroepitaxial template to grow other periodic or more size-uniformized layer on top, for example, higher-density perpendicular magnetic recording media by co-sputtering of magnetic+nonmagnetic material, e.g., (CoCrPt+$SiO_2$). Vertically textured, nanocomposite magnetic recording layer with a $SiO_2$ spacer between magnetic columns can be obtained with substantially improved uniformity of magnetic grain diameter.

The spinodally patterned nano islands or nano holes can be utilized for patterned electrochemical deposition, chemical precipitation or dissolution reaction, or chemical vapor deposit reaction, for example, to induced preferential, guided precipitation on these existing nano islands. This is schematically illustrated in FIG. 17. The spinodally patterned nano islands of FIG. 17(a) or periodically protruding configuration of FIG. 17(c) can be the template basis for deposition of another metal, alloy, or semiconductor illustrated in FIG. 17(b) or FIG. 17(d). High-density magnetic recording media can be fabricated by such guided deposition of high coercivity materials, for example, the well known $L1_0$ phases of FePt or CoPt type intermetallic compounds, $[CoPd]_n$ or $[FePt]_n$ type alternating multilayers, or Co—Cr—Pt+SiO2 type perpendicular magnetic recording media.

The resultant patterned recording media based on the structure of FIG. 10 and FIGS. 13-17 can be made to exhibit a high recording density of at least 200 Gb/in$^2$ density, preferably at least 500 Gb/in$^2$, even more preferably at least 1 Terabit/in$^2$ density in a periodic fashion over a large area of at least 0.01 mm$^2$, preferably at least 0.1 mm$^2$, even more preferentially at least 1 mm$^2$. The materials for the discrete magnetic nano-islands can be selected from high magnetocrystalline anisotropy, high coercivity materials with desired coercivity values of at least 1000 Oe, preferably at least 3000 Oe., e.g., the well known $L1_0$ phases of FePt or CoPt type intermetallic compounds, $[CoPd]_n$ or $[FePt]_n$ alternating multilayers, Co—Cr—Ta—Pt type alloys, Sm—Co, Nd—Fe—B, and other rare-earth alloys, etc. Soft magnet underlayer (SUL) with relatively low coercive force (e.g., with a value of less than 10 oersteds, preferably less than 2 oersteds as is common with soft magnet alloys such as Ni—Fe permalloy, Fe—Co base alloys, amorphous or nanocrystalline alloys such as Fe—Co—B, Fe—Ta—N) may optionally be placed under the patterned recording media as illustrated in FIG. 15(a) and (b). As is well known the SUL layer helps to improve the magnetic behavior and reduce the self demagnetization factor of the hard magnetic recording bit.

iii). Semiconductor Quantum Dot Devices

The quantum dot nanoparticles such as CdSe, CdS, CdTe, ZnS, InP, InAs, InGaAs, GaAs, GaN, and Si are suitable for quantum dot devices such as LEDs (light emitting diodes), quantum laser, photosensitization apparatus such as solar cells, optical switches, luminescent devices including displays and identification tags. An example device application is illustrated in FIG. 18. The drawing represents a quantum-dot-based or surface-plasmon-resonance-based photoluminescent or electroluminescent device using stimulated luminescence from an array of periodically spaced, spinodally created, more size-uniform nano-island quantum dots.

One of the known problems in the current state-of-the-art semiconductor quantum dot devices such as based on lattice-mismatch-induced island formation is the non-uniformity of the quantum dot size. Such a spectrum of particle size results in an undesirably broad wavelength spectrum in the emitted beam. In order to solve this problem, a uniformity of quantum dot particle size is desirable. Spinodally patterned, periodic array of semiconductor quantum dot nanoparticles, nano-islands, or the tips of vertical nanorods filling the nanoporous membranes can be stimulated to emit sharply defined light with definite wavelength and color on illumination of relatively broad incident light. The specific photoluminescence wavelength can be controlled by size and shape of the quantum dots, typically in the range of 2-30 nm. The semiconductor quantum dots of the long-range periodic array configuration can be made of materials including Si, CdSe, CdS, CdTe, ZnS, InP, InAs, InGaAs, GaAs, and GaN. The periodic quantum dot array is suitable for quantum dot devices such as LEDs (light emitting diodes), quantum laser, photosensitization apparatus such as solar cells, optical switches, luminescent devices including displays and identification tags.

Likewise, highly conductive metal nanoparticles or nanoislands, such as Au, Ag, Pt, Ni, Co in the size regime of 2-30 nm can produce strong and sharply defined surface plasmon resonance (SPR) emission. The photoluminescence wavelength and color of SPR nanoparticles are also controlled by their size and shape. The periodic surface plasmon resonance nanoparticle array, is suitable for photonic and luminescent devices including displays and identification tags. Similarly as in the case of semiconductor quantum dots, the spinodally patterned, periodic array of surface plasmon resonance metallic nano-islands provide desirably more uniform island size, and hence a sharp and less broad emission spectrum.

iv). Periodically Ion Implanted Structure and Devices

In addition, nano-doped semiconductors with an array of periodically nanoscale implanted structures based on spinodal decomposition can be produced as illustrated in FIG. 19. Ion implantation of semiconductor dopants (e.g., with boron ions for p-type doping and phosphorous ions for n type doping into Si), magnetic semiconductor dopants (e.g., Mn or Co ion implantation into GaN, GaAs, $TiO_2$, Si, etc.) can be performed using the nano-island array as a periodic mask that blocks ion implantation as depicted in FIG. 19(a). In general, nano-island or nano-pore array of relatively heavy metals such as Au, Pd, Pt, Os, W are preferred for use as such a implantation mask for efficient blockage of reduction of ion penetration. For ion implantation of lighter ions such as boron or phosphorous, less heavy metal nano-island or nano-pore array can be used. In the arrangement of FIG. 19(a), the implanted ions selectively penetrate the substrate at locations surrounding the nano-island or nano-pore array, as illustrated in the nanocomposite structure of FIG. 19(b). Such nanoscale (e.g., 1-50 nm. preferentially 2-30 nm scale), periodic array of nano-doped compositional variations are useful for creating new nano devices of semiconductor array, quantum dot array, field effect transistor (FET) array, spintronics device array, light emitting diode (LED) array, etc.

The ion implantation method using spinodally fabricated nano-mask can also be utilized as a means of creating nano-cavity features. Doping of semiconductors such as Si substantially influences the chemical etch rate. See articles by J. W. Judy, Smart Materials and Structures, Vol. 10, page 1115 (2001), Hsieh et al, J. Micromechanics and Microengineering, Vol. 12, page 574 (2002), E. A. Ogrizlo et al, Journal of Applied Physics, Vol. 67, page 3115 (1990), V. A. Ukraintsev et al, Journal of Vacuum Science & Technology, Vol. B 16.1, page 476 (1998), W. C. Tian et al, Journal of Vacuum Science & Technology, Vol. B 19.2, page 433 (2001). For example, boron doping in silicon at a concentration range of $10^{20}/cm^3$ can reduce the etch rate of Si using KOH or ethylene diamine pyrocatechol (EDP) by at least one order of magnitude. It is also known that n-type doping of Si (e.g., with phosphorous) significantly increases the dry etch rate (by RIE) using halogen-based reactive plasmas as compared to the undoped or p-type doped Si. Using these effects, the processing of FIG. 19(a) can be utilized to create periodic nano-pillar array or nano-cavity array in semiconductors, as illustrated in FIG. 19(c). Both the nano-pillar array or nano-cavity array in semiconductors in the nanometer regime of 2-10 nm dimensional scale can be useful as luminescent devices or LED devices.

v). Nano-Imprint Master Mask Fabrication

FIG. 20 schematically illustrates another process of using the periodic ordered nano-island array as a nano-imprint master mask. Such a periodic ordered nano-island array mask can be prepared by various techniques described in this disclosure. In FIGS. 20(a)-(c), the nano-imprint master pattern is compressing onto a soft substrate to create an array of long-range ordered nano-protrusion or nano-cavity array. Such a periodic ordered structure can be used as an optical grating, optically less reflective surface, or as a mold or substrate (e.g., with a thin metal or semiconductor coating) to fabricate various nano devices including actively photonic or luminescence devices, magnetic recording media and magnetic sensors, catalytic surfaces, addressable memory, switch or logic devices.

An alternative embodiment of the nano-imprint application of the periodic nanostructure is to deposit nanoscale materials on another substrate to create a different types of new materials and devices, as illustrated in FIGS. 20(d)-(g). The master pattern with protruding nano-islands or nano-pillars is first dipped onto a flat pad coated with an ink or paste containing desired materials to pick up nano-quantity of the ink/paste material, as illustrated in FIG. 20(d), and then is made to contact a flat substrate to transfer the material as nano-islands as illustrated in FIG. 20(e) and (f). The ink or paste can be a passive polymer, active polymer such as light emitting polymer in response to electrical or optical stimulations, or a composite of liquid polymer base and solid metal/alloy nanoparticles or metal-containing salts. In the case of the composite polymer containing metal/alloy nanoparticles or metal-containing salts, the substrate with deposited nano-island ink/paste can be baked at high temperature to burn away the polymer and leave consolidated metal/alloy or compound nano-islands as illustrated in FIG. 20(g). Such nano-islands can be used for various nano devices including ultra-high-density magnetic recording media, magnetic field sensor, photonic or luminescent devices including quantum dot devices, surface plasmon resonance devices, light emitting devices, energy conversion devices such as catalytic fuel cells and automobile catalytic converters, displays and identification tags, and addressable memory, switch or logic devices.

The long-range periodic nano-imprint master pattern can also be used as a lithography/etch mask for e-beam nano-lithography, soft-x-ray nano-lithography, extreme UV nano-lithography, ion beam implantation patterning, chemical etch patterning or reactive ion etch patterning to produce periodic nanofeatures. The material for the transferred nano-imprinted pattern in FIG. 20(f) needs to be selected accordingly to serve as appropriate blockage for incoming electrons, x-ray, UV light, ion beam, and etchant chemicals. For example, the mask for acid chemical etch can be polymers, oxides such as low melting point oxides and Au or Ag based alloys that can be easily fused as a solid coating on baking of the transferred pattern.

One of the advantages of the nano-imprinted devices containing long-range periodic nanofeatures is the relatively low cost and high throughput in manufacturing. Once a reliable nano-imprint master pattern is generated, many devices can easily be manufactured by simply repeating the nano-imprint transfer process on a multitude of substrates.

vi). Spinodally Guided Anodized Membrane Fabrication

The spinodally fabricated nano-pore structure of FIG. 21(a) can be used as an etch mask to create an array of crators in the aluminum substrate. Such etched crator nanostructures can be utilized as a guiding hole for initiation of anodization, for example, anodization of aluminum film into AAO (anodized aluminum oxide) membrane as illustrated in FIGS. 21(b)-(d). In view of the general difficulty of fabricating sub-20 nm nano-pores in AAO, such a guided anodization can be very useful for realization of periodic nano-pore structure with a sub-20 nm feature size.

vii). Addressable Electronic Devices

The spinodally based nanostructures can be used to provide long-range periodic placement of nano-elements and thus can be useful for a variety of x-y addressable devices such as memories, switches, and logic devices. One example is schematically illustrated in FIG. 22, which includes an x-y addressable switch, memory or logic device comprising a long-range periodic array of nano island elements. Periodic island array of memory element can be placed between x-y address lines at the cross-points or slightly off the cross-point location as illustrated in the figure. Insulators and other structural elements such as heaters or transistor switches may also be provided at or near each cross-point. Such addressable devices comprising the periodic nanofeature array include flash memory such as NOR or NAND type flash memory (e.g., utilizing charge storage floating gate), resistance random access memory (RRAM), phase-change random access memory (PRAM), magnetic random access memory (MRAM), transistor array, single electron transistor array, quantum computing element array, etc. Another example of such a nanofeature array for matrix addressable memory is for the case of phase change random access memory (PRAM). Each of the phase-change memory elements at cross-point of x-y addressable configuration, for example, Ge—Sb—Te alloy islands go through amorphous vs crystalline phase changes with significant changes of electrical resistance. The activation (writing) of each memory element is performed by either laser pulse or electrical current pulse. The reading of the memory bit status (e.g., 1 or 0) is performed, e.g., by electrical measurement using a lower-intensity voltage or current pulse.

Figure 23:
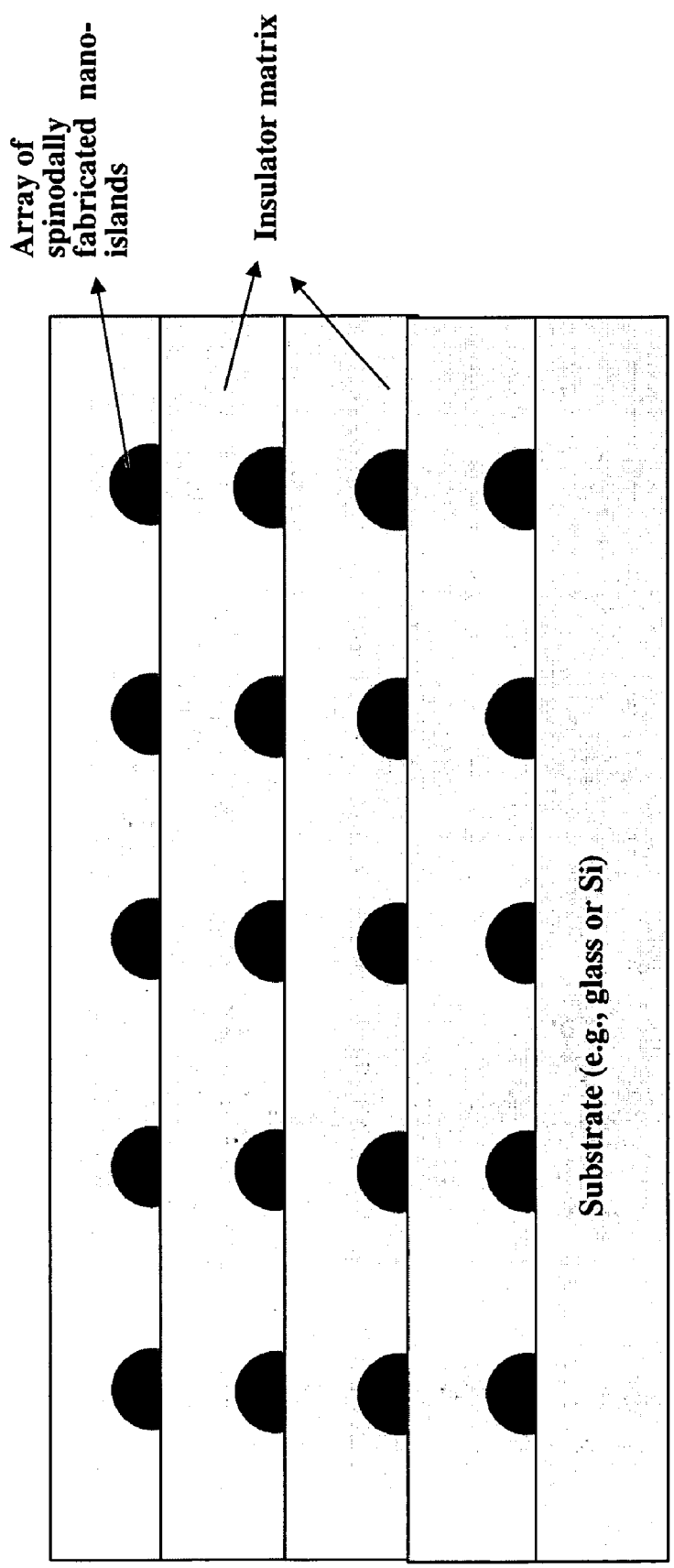
FIG. 23 shows a charge-storage-based, three dimensional memory device comprising an array of periodically spaced, spinodally created nano-island storage elements.

Shown schematically in FIG. 23 is a charge-storage-based, three dimensional memory device comprising the array of periodically spaced, spinodally created nano-island storage elements. Such a storage device is useful for a variety of devices, including ultra-high-density flash memory devices. Such a three-dimensional structure can be fabricated by repeated deposition of each layer and spinodal patterning, followed by deposition of insulator. Appropriate electrodes may be added during such layer building processes.

viii) Efficient Catalyst Array

Because of the extremely fine nano-island size with guaranteed spacing (non-agglomeration) between neighboring islands, which ensures availability of maximum catalyst surface area, the long-range periodic ordered nano-island configuration is suitable as efficient, less agglomerating catalyst structure, for example, Pt, Pd, Rh nano-island array for fuel cell electrodes, catalytic converter for automobiles and other chemical/electrochemical reactions.

ix) Seeding for Synthesis of Periodic Nanotubes/Nanowires

As illustrated in FIG. 9, the ordered nano-island array prepared by spinodal processing is also useful for enabling synthesis of periodically spaced nanowire array because each of the periodically positioned catalyst nanoparticles, for example, 1-50 nm diameter periodic Ni, Co or Fe nano-islands in periodic array on Si substrate can serve as nuclei at the carbon nanotube growth front during chemical vapor deposition from a carbon-containing gas, thus producing a long-range ordered nanotubes array. Such a periodic nano-island array can be utilized as a highly desirable seeding technique for fabrication of other types of periodically spaced nanowires such as ZnO or Si nanowires if gold (Au) or Au alloy nano islands are spinodally patterned. There are obvious advantages of having a periodic arrangement of vertically aligned nanotubes/nanowires. Since they are equally spaced-apart, there is less probability of agglomeration of neighboring nanotubes/nanowires by van der Waal's force and other surface interactions, which provides more surface areas available for fuel cell, hydrogen storage and other catalytic applications. The reduced agglomeration of nanotubes/nanowires ensures uniformity in the aspect ratio for uniform field emission behavior. The ability to have periodic placement of nanotubes/nanowires is desirable for fabrication of x-y matrix addressable nano devices such as memory, switch and logic devices, and vertical nano-interconnections.

Only a few examples and implementations are described. Other implementations, variations and enhancements are possible based on what is described in this application. For example, instead of a perfect periodic structure, a nearly periodic structure or non-periodic structure but having a substantially similar sized nano-islands or nano-pores (e.g., less than 30% variation in average diameter) can result from annealing of spinodal alloys. Such a non-ideally-periodic, spinodally fabricated structure is sometimes sufficient for device applications.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method, comprising:
forming a layer to be patterned over a substrate;
forming a spinodal alloy layer on the layer to be patterned, wherein the spinodal alloy layer comprises a plurality of alloy elements and, when the spinodal alloy layer is at a temperature within a spinodal decomposition temperature range for the two phases formed by the alloy elements, decomposes into two phases that are spatially separated and spatially interleaved in a spinodally decomposed periodic structure;
controlling a temperature of the spinodal alloy layer to be within the spinodal decomposition temperature range to form the spinodally decomposed periodic structure;
patterning the spinodal alloy layer in the spinodally decomposed periodic structure to remove one of the two phases and hence to transform the spinodal alloy layer into a patterned mask which exposes the layer to be patterned according to the spinodally decomposed periodic structure;
patterning the layer to be patterned through the patterned mask in the spinodal alloy layer to form a patterned layer;
wherein:
the patterned layer is an array of isolated islands on the substrate, and
the method further comprising:
removing the patterned mask in the spinodal alloy layer; and
subsequently forming a coating layer made of a single metal element or an alloy to cover the isolated islands and areas of the substrate exposed between the isolated islands; and
applying an annealing treatment to the coating layer to cause the coating layer to retract from the areas of the substrate between the isolated islands so that the isolated islands are separately covered by the coating layer leaving a portion of each area of the substrate between two adjacent isolated islands free of the coating layer.

2. The method as in claim 1, wherein:
the controlling of the temperature of the spinodal alloy layer to be within the spinodal decomposition temperature range comprises:
heating the spinodal alloy layer from a lower temperature into the spinodal decomposition temperature range.

3. The method as in claim 1, wherein:
the controlling of the temperature of the spinodal alloy layer to be within the spinodal decomposition temperature range comprises:
cooling the spinodal alloy layer from a higher temperature into the spinodal decomposition temperature range.

4. The method as in claim 1, further comprising:
subsequently forming a third structure within an opening or a ridge of the patterned layer.

5. The method as in claim 4, wherein:
the third structure is a magnetic recording structure.

6. The method as in claim 4, wherein:
the third structure is a hetero expitaxially grown structure.

7. The method as in claim 4, wherein:
the third structure is a preferential nucleation grown structure.

8. The method as in claim 4, wherein:
the third structure is a quantum dot structure operable to emit light under optical excitation.

9. The method as in claim 8, wherein:
the quantum dot structure comprises one of Si, CdSe, CdS, CdTe, ZnS, InP, InAs, InGaAs, GaAs, and GaN.

10. The method as in claim 4, wherein:
the third structure is a surface plasmon resonance structure made of an electrically conductive metallic material.

11. The method as in claim 10, wherein:
the third structure comprises one of Au, Ag, Pt, Ni, and Co.

12. The method as in claim 1, wherein:
the layer to be patterned is made of a hard magnetic material.

13. The method as in claim 12, wherein:
the hard magnetic material comprises FePt, CoPt ,Sm—Co, CoCrPt, Nd—Fe—B, [CoPd]n alternating multilayer, or [FePt]n alternating multilayer.

14. The method as in claim 12, further comprising:
prior to forming the layer to be patterned, forming a soft magnetic underlayer over the substrate on which the layer to be patterned is subsequently formed and patterned.

15. The method as in claim 14, wherein:
the soft magnetic underlayer comprises a magnetic material exhibiting a magnetic coercive force less than 10 oersteds.

16. The method as in claim 14, wherein:
the soft magnetic underlayer comprises an Ni-Fe permalloy, Fe—Co base alloy, Fe—Co—B alloy, and Fe—Ta—N alloy.

17. The method as in claim 1, wherein:
the layer to be patterned includes a soft magnetic underlayer and a hard magnetic layer on top of the soft magnetic underlayer.

18. The method as in claim 17, further comprising:
applying an annealing treatment to the soft magnetic underlayer and the hard magnetic layer.

19. The method as in claim 1, further comprising:
applying an additional annealing treatment to cause alloying between the coating layer and each isolated island covered by the coating layer.

20. The method as in claim 1, wherein:
the layer to be patterned is made of a soft magnetic material; and
the coating layer is made of a hard magnetic material.

21. The method as in claim 1, wherein:
the layer to be patterned is made of a catalyst for nanowires or nanotubes; and
the patterned layer is an array of islands of the catalyst; and
the method further comprising:
performing a chemical vapor deposition process to grow nanowires or nanotubes at sites of the islands.

22. The method as in claim 21, wherein
the layer to be patterned is made of Ni, Fe or Co as a catalyst for growing carbon nanotubes.

23. The method as in claim 21, wherein
the layer to be patterned is made of Au as a catalyst for growing nanotubes.

* * * * *

UNITED STATES PATENT AND TRADEMARK OFFICE
CERTIFICATE OF CORRECTION

| | | |
|---|---|---|
| PATENT NO. | : 7,820,064 B2 | |
| APPLICATION NO. | : 11/914106 | |
| DATED | : October 26, 2010 | |
| INVENTOR(S) | : Sungho Jin | |

It is certified that error appears in the above-identified patent and that said Letters Patent is hereby corrected as shown below:

On the Face Page, in Field (56), under "OTHER PUBLICATIONS", in Column 2, Line 3, please delete "forAdvanced" and insert -- for Advanced --, therefor.

In FIG. 14, Sheet 14 of 23, for Point "(c)", in Line 2, please delete "[e.g.," and insert -- e.g., --, therefor.

In Column 1, Line 60, please delete "the these" and insert -- these --, therefor.

In Column 11, Line 56, please delete "implemetiaons," and insert -- implementations, --, therefor.

In Column 13, Line 41, please delete "nanaotube" and insert -- nanotube --, therefor.

In Column 14, Line 4, please delete "nanaowires" and insert -- nanowires --, therefor.

In Column 14, Line 46, please delete "L1o" and insert -- $L1_o$ --, therefor.

In Column 15, Line 33, please delete "spinocal" and insert -- spinodal --, therefor.

In Column 16, Line 7, please delete "L1o" and insert -- $L1_o$ --, therefor.

In Column 16, Line 47, please delete "superpapramagnetic" and insert -- superparamagnetic --, therefor.

In Column 18, Line 45, please delete "(CoPt+SiO2).)." and insert -- (CoPt+SiO2). --, therefor.

In Column 25, Line 23, in Claim 13, please delete "[CoPd]n" and insert -- $[CoPd]_n$ --, therefor.

In Column 25, Line 24, in Claim 13, please delete "[FePt]n" and insert -- $[FePt]_n$ --, therefor.

Signed and Sealed this
Third Day of May, 2011

David J. Kappos
*Director of the United States Patent and Trademark Office*

CERTIFICATE OF CORRECTION (continued)
U.S. Pat. No. 7,820,064 B2

In Column 26, Line 27, in Claim 22, please delete "wherein" and insert -- wherein: --, therefor.

In Column 26, Line 30, in Claim 23, please delete "wherein" and insert -- wherein: --, therefor.